United States Patent [19]
Yakabe et al.

[11] Patent Number: 6,118,313
[45] Date of Patent: Sep. 12, 2000

[54] DIGITAL FREQUENCY MULTIPLYING CIRCUIT

[75] Inventors: Masayuki Yakabe; Jirou Ookuri, both of Kanagawa, Japan

[73] Assignee: NEC Corporation, Tokyo, Japan

[21] Appl. No.: 09/036,020

[22] Filed: Mar. 6, 1998

[30] Foreign Application Priority Data

Mar. 6, 1997 [JP] Japan ................................ 9-051632

[51] Int. Cl.[7] .................................................. H03B 19/00
[52] U.S. Cl. ........................... 327/116; 327/121; 327/122
[58] Field of Search .................................... 327/116, 119, 327/120, 121, 122, 291

[56] References Cited

U.S. PATENT DOCUMENTS

| | | | |
|---|---|---|---|
| 5,260,608 | 11/1993 | Marbot | 307/262 |
| 5,422,835 | 6/1995 | Houle et al. | 364/703 |
| 5,514,990 | 5/1996 | Mukaine et al. | 327/116 |
| 5,530,387 | 6/1996 | Kim | 327/119 |
| 5,801,559 | 9/1998 | Sawai et al. | 327/116 |
| 5,933,035 | 8/1999 | Bezzant et al. | 327/119 |

FOREIGN PATENT DOCUMENTS

| | | |
|---|---|---|
| 0 762 262 | 3/1997 | European Pat. Off. . |
| 4-105413 | 4/1992 | Japan . |
| 4-105724 | 9/1992 | Japan . |
| 8-223003 | 8/1996 | Japan . |

*Primary Examiner*—Jung Ho Kim
*Attorney, Agent, or Firm*—Young & Thompson

[57] ABSTRACT

A digital frequency-doubling circuit includes a pair of cascaded first delay circuits, each including a plurality of cascaded delays, and a first stage of the cascaded first delay circuits receiving an input signal to be frequency-doubled, and an exclusive-OR circuit receiving the input signal and a delayed output signal outputted from the first stage of the cascaded first delay circuits, for generating a frequency-doubled signal. A delay amount comparator receives a first delayed output signal outputted from a second stage of the cascaded first delay circuits and a second delayed output signal outputted from a second delay circuit of a small delay receiving the first delayed output signal, for performing comparison at a transition timing of the input signal, to discriminate whether the obtained frequency-doubled signal advances or delays in comparison of an optimum duty ratio. A delay amount selector responds to the result of the comparison of the delay amount comparator for generating a delay control signal optimizing the delay amount of the cascaded first delay circuits. Thus, the frequency-doubled signal can be automatically controlled to have a optimum duty ratio.

11 Claims, 17 Drawing Sheets

| STATUS NO. | INPUT SIGNAL | | | | | OUTPUT SELECTION SIGNAL | | | | |
|---|---|---|---|---|---|---|---|---|---|---|
| | RS | ci | dw | st | up | ds1 | ds2 | ~ | ds(n-1) | dsn |
| 0 | 1 | × | × | × | × | 0 | 0 | ~ | 1 | 0 |
| 1 | 0 | ↑ | 0 | 0 | 1 | 0 | 0 | ~ | 0 | 1 |
| 2 | 0 | ↑ | 1 | 0 | 0 | 0 | 0 | ~ | 1 | 0 |
| ? | ? | ? | ? | ? | ? | ? | ? | ? | ? | ? |
| n-3 | 0 | ↑ | 1 | 0 | 0 | 0 | 1 | ~ | 0 | 0 |
| n-2 | 0 | ↑ | 1 | 0 | 0 | 1 | 0 | ~ | 0 | 0 |
| n-1 | 0 | ↑ | 0 | 0 | 1 | 0 | 1 | ~ | 0 | 0 |
| n | 0 | ↑ | 0 | 1 | 0 | HOLD PRECEDING STATUS | | | | |

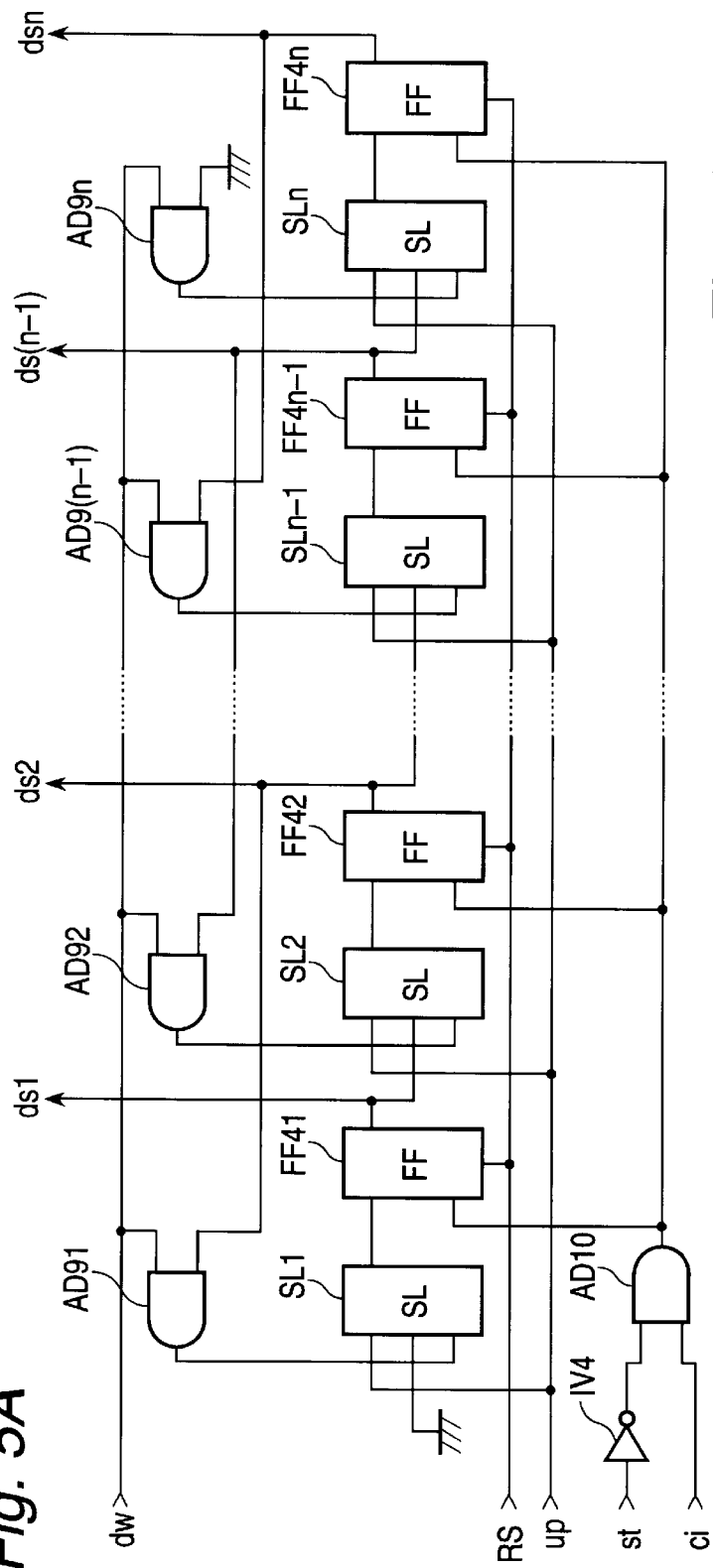
Fig. 5A
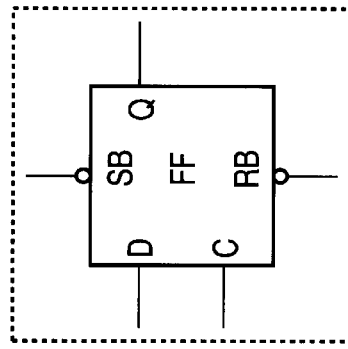
Fig. 5D
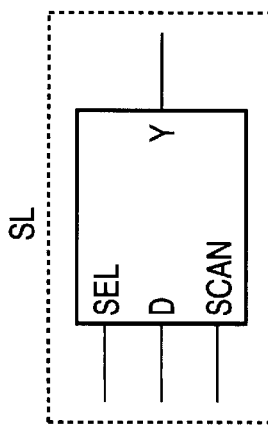
Fig. 5B
| SEL | D | SCAN | Y |
|---|---|---|---|
| 1 | A | X | A |
| 0 | X | B | B |
Fig. 5C

Fig. 6

| INPUT SIGNAL | | | | | | | | | | OUTPUT SIGNAL |
|---|---|---|---|---|---|---|---|---|---|---|
| do1 | do2 | ~ | do(n-1) | don | ds1 | ds2 | ~ | ds(n-1) | dsn | da |
| da1 | da2 | ~ | da(n-1) | dan | 1 | 0 | ~ | 0 | 0 | da1 |
| | | | | | 0 | 1 | ~ | 0 | 0 | da2 |
| | | | | | ⟨ | | | | | |
| | | | | | 0 | 0 | ~ | 1 | 0 | da(n-1) |
| | | | | | 0 | 0 | ~ | 0 | 1 | dan |

Fig. 7

| STATUS NO. | INPUT SIGNAL | | | | OUTPUT SIGNAL | | |
|---|---|---|---|---|---|---|---|
| | RS | $\overline{ci}$ | da2 | db | up | st | dw |
| 1 | 0 | ↓ | 0 | 0 | 0 | 0 | 1 |
| 2 | 0 | ↓ | 1 | 0 | 0 | 1 | 0 |
| 3 | 0 | ↓ | 1 | 1 | 1 | 0 | 0 |
| 4 | 0 | ↓ | 0 | 1 | 1 | 0 | 0 |
| 5 | 1 | × | × | × | 1 | 0 | 0 |

Fig. 16B OSa OUTPUT STOPPER

Fig. 17

| INPUT SIGNAL | | | | OUTPUT SIGNAL | | |
|---|---|---|---|---|---|---|
| ci | dsa1 | dsa2 | dsa3 | do1 | do2 | do3 |
| 0 | 1 | 0 | 0 | 0 | 1 | 1 |
| 1 | 1 | 0 | 0 | 1 | 1 | 1 |
| 0 | 0 | 1 | 0 | 0 | 0 | 1 |
| 1 | 0 | 1 | 0 | 1 | 1 | 1 |
| 0 | 0 | 0 | 1 | 0 | 0 | 0 |
| 1 | 0 | 0 | 1 | 1 | 1 | 1 |

DIGITAL FREQUENCY MULTIPLYING CIRCUIT

BACKGROUND OF THE INVENTION

1. Field of the invention

The present invention relates to a digital frequency multiplying circuit, and more specifically to a digital frequency multiplying circuit capable of generating a pulse having a desired pulse width without being influenced by fluctuation in a manufacturing process and variation in environment.

2. Description of related art

Referring to FIG. 18A, which illustrates a general example of the prior art digital frequency multiplying circuit, the shown digital frequency multiplying circuit includes a plurality of delays dl1 to dln cascaded between an input terminal for receiving a clock CK and one input of an exclusive-OR circuit (called an "EX-OR circuit" hereinafter) EXR3, the other input of the EX-OR circuit EXR3 being connected directly to the clock input terminal, so that a frequency-multiplied signal CK2F is obtained from the EX-OR circuit EXR3.

Referring to FIG. 18A and FIG. 18B which is a timing chart illustrating an operation of the digital frequency multiplying circuit shown in FIG. 18A, the clock signal CK is delayed by the delays dl1 to dln which are constituted of an even number of inverters, so that a delayed signal CLK is obtained. Here, an ideal delay time means that assuming that the period of a logical high level (called "1" hereinafter) of the clock signal CK is "T", a delay time from the moment the clock signal CK rises up from a logical low level (called "0" hereinafter) to "1" to the moment the delayed clock signal CKD rises up from "0" to "1" is T/2. This delayed clock signal CKD and the clock signal CK is exclusive-ORed in the EX-OR circuit EXR3, so that a signal CK2A having double the frequency of the clock signal CK is outputted from the EX-OR circuit EXR3 as the signal CK2F.

In this digital frequency multiplying circuit, the pulse width of the frequency-multiplied signal is determined by the delay time of the inverters constituting the delay. This delay time is determined at the time of design in accordance with a desired pulse width, and is greatly influenced by fluctuation in a manufacturing process of a semiconductor integrated circuit and variation in environment. Therefore, when the delay time from the rising of the clock signal CK to the rising of the delayed clock signal CKD becomes larger than T/2, a frequency-multiplied signal CK2B as shown in FIG. 18B is obtained from the EX-OR circuit EXR3. On the other hand, when the delay time from the rising of the clock signal CK to the rising of the delayed clock signal CKD becomes smaller than T/2, a frequency-multiplied signal CK2C as shown in FIG. 18B is obtained from the EX-OR circuit EXR3.

Both of these frequency-multiplied signals CK2B and CK2C are greatly deviated from the duty ratio of 50%. Namely, there is a problem in which a stable pulse width cannot be obtained.

In order to overcome this problem, many inventions have been applied for patent. One example of the inventions for overcoming the problem is disclosed in Japanese Patent Application Pre-examination Publication No. JP-A-04-105413 (the content of which is incorporated by reference in its entirety into this application, and also an English abstract of JP-A-04-105413 is available from the Japanese Patent Office and the content of the English abstract of JP-A-04-105413 is also incorporated by reference in its entirety into this application).

Referring to FIG. 19, there is shown a circuit diagram of one example of the semiconductor delay circuit disclosed in JP-A-04-105413. This delay circuit is different from the prior art shown in FIG. 18A in that a timing adjusting circuit TCT is inserted between a variable delay circuit VDL composed of a group of cascaded delays DL and one input of an EX-OR circuit EXR4 having the other input connected to receive a pulse input signal PIN.

The timing adjusting circuit TCT includes a multiplexor MPX having an output terminal Y connected to the one input of an EX-OR circuit EXR4 and a plurality of input terminals D0 to Dn connected to receive an input signal d0 branched from the pulse input signal PIN for the delay group DL, a plurality of signals d1 to d(n−1) which are obtained from the delay group DL and which are deviated from one another in timing, and a signal dn outputted from the final stage of the delay group DL. A plurality of control terminals of the multiplexor MPX is connected to parallel outputs of a shift register SFR, respectively. A data input of the shift register SFR is connected to receive a serial data SI, and a clock input of the shift register SFR is connected to receive a shift clock SCK.

In this prior art, the high level pulse width can be adjusted to a desired value, by supplying the EX-OR circuit EXR4 with an output "di1" of the multiplexor MPX obtained by delaying only the timing of the pulse input signal PIN by the delay group DL. Namely, by setting the delay time of the delayed signal dn at a relatively long value, a suitable delayed signal having a delay time shorter than that of the delayed signal dn is selected by the multiplexor MPX in order to compensate for fluctuation in the delay time caused by the fluctuation in a manufacturing process.

Referring to FIG. 20, there is shown a circuit diagram of another example of the semiconductor delay circuit disclosed in JP-A-04-105413. This delay circuit is different from the prior art shown in FIG. 19 in that a D-type flipflop FF5 is used in place of the EX-OR circuit EXR4 and an erasable programmable ROM EPROM is used in place of the shift register SFR. Namely, an output "di2" of the timing adjusting circuit TCT is connected to a D input of the D-type flipflop FF5, and a reference clock CKI is supplied to a clock input of the D-type flipflop FF5.

The timing adjusting circuit TCT is so constructed that a signal d0 obtained from the pulse input signal DIN and a plurality of signals d1 to dn obtained from the delay group DL and deviated from one another in timing, are supplied to the multiplexor MPX, and one of these signals d0 to dn is selected by the multiplexor MPX and outputted as the output signal "di2". The multiplexor MPX is set by writing data into the erasable programmable ROM EPROM Thus, the high level pulse width can be adjusted to a desired value, by supplying the D-type flipflop with the output "di2" of the multiplexor MPX obtained by delaying only the timing of the pulse input signal DIN by the delay group DL.

However, the above mentioned prior art frequency multiplying circuits have the following problems:

A first problem is that the duty ratio of the obtained frequency-multiplied signal varies. The reason for this is as follows:

When the delay circuit is constituted of cascaded inverters, the total delay amount is determined by a product of the delay amount of one inverter by the number of the cascaded inverters. However, because of fluctuation in a manufacturing process and variation in operating environment such as fluctuation of the power supply voltage, the delay amount of each inverters varies, so that the delay time as designed cannot be obtained. As a result, the duty ratio of the frequency-multiplied signal varies.

A second problem is that it cannot follow the fluctuation of the power supply voltage after completion of the adjustment The reason for this is as follows, In the prior art example configured to stabilize the duty ratio, namely, the pulse width, of the frequency-multiplied signal, at an initial setting time, the delay amount is determined by the timing adjusting circuit including the multiplexor therein, and the control signal supplied to the multiplexor for determining the delay amount is fixed. Therefore, the frequency-multiplying circuit cannot follow an unexpected variation of the power supply voltage in an operation of the frequency-multiplying circuit.

A third problem is that it is necessary to initialize the delay amount and to supply an input signal to the multiplexor for setting the delay amount. The reason for this is as follows:

In the prior art examples disclosed in the above referred Japanese patent publication, the delay amount is determined by the multiplexor and the others. The control signal for the multiplexor is given from the EPROM or an external signal. The setting of the multiplexor is carried out by changing the delay amount, little by little, while monitoring the frequency-multiplied signal. In the case that the multiplexor is controlled by external signal, the set condition disappears at each time of the power-off, and therefore, it is necessary to conduct the setting at each time of the power-on.

SUMMARY OF THE INVENTION

Accordingly, it is an object of the present invention to provide a digital frequency multiplying circuit which has overcome the above mentioned defects of the conventional one.

Another object of the present invention is to provide a digital frequency multiplying circuit capable of generating a frequency-multiplied signal having a stable duty ratio which is not influenced by fluctuation in a manufacturing process and variation in operating environment such as fluctuation of the power supply voltage.

Still another object of the present invention is to provide a digital frequency multiplying circuit which can generate a frequency-multiplied signal having a stable duty ratio and which no longer requires the setting of the delay amount at each time of the power-on.

The above and other objects of the present invention are achieved in accordance with the present invention by a digital frequency-multiplying circuit comprising a plurality of cascaded first delay circuits, each including a plurality of cascaded delays, and a first stage of the cascaded first delay circuits receiving an input signal to be frequency-doubled, and a logic circuit receiving the input signal and a delayed output signal outputted from at least the first stage of the cascaded first delay circuits, for generating a frequency-multiplied signal, a delay amount discriminating means receiving a first delayed output signal outputted from a final stage of the cascaded first delay circuits for discriminating at a transition timing of the input signal, whether the frequency-multiplied signal advances or delays in comparison of an optimum duty ratio, and a delay amount control means responding to the result of the discrimination of the delay amount discriminating means for generating a delay control signal optimizing the delay amount of the cascaded first delay circuits.

The above and other objects, features and advantages of the present, invention will be apparent from the following description of preferred embodiments of the invention with reference to the accompanying drawings.

BRIEF DESCRIPTION OF THE DRAWINGS

FIG. 5A is a circuit diagram of the delay amount selector DLS incorporated in the frequency-doubling circuit shown in FIG. 1;

FIG. 5B is a block diagram of the selector SL incorporated in the delay amount selector DLS shown in FIG. 5A;

FIG. 5C is a truth table of the selector SL;

FIG. 5D a block diagram of the flipflop incorporated in the delay amount selector DLS shown in FIG. 5A;

FIG. 6, a truth table of the multiplexor ML incorporated in the frequency-doubling circuit shown in FIG. 1;

FIG. 7 is a truth table of the delay amount comparator CMP incorporated in the frequency-doubling circuit shown in FIG. 1;

FIG. 16B is a block diagram of the output stopper OSa corresponding to the four stages in the large delay group DLa;

FIG. 17 is a truth table of the large delay group DLa;

DESCRIPTION OF THE PREFERRED EMBODIMENTS

Now, embodiments of the present invention will be described in detail with reference to the drawings.

Figure 1:
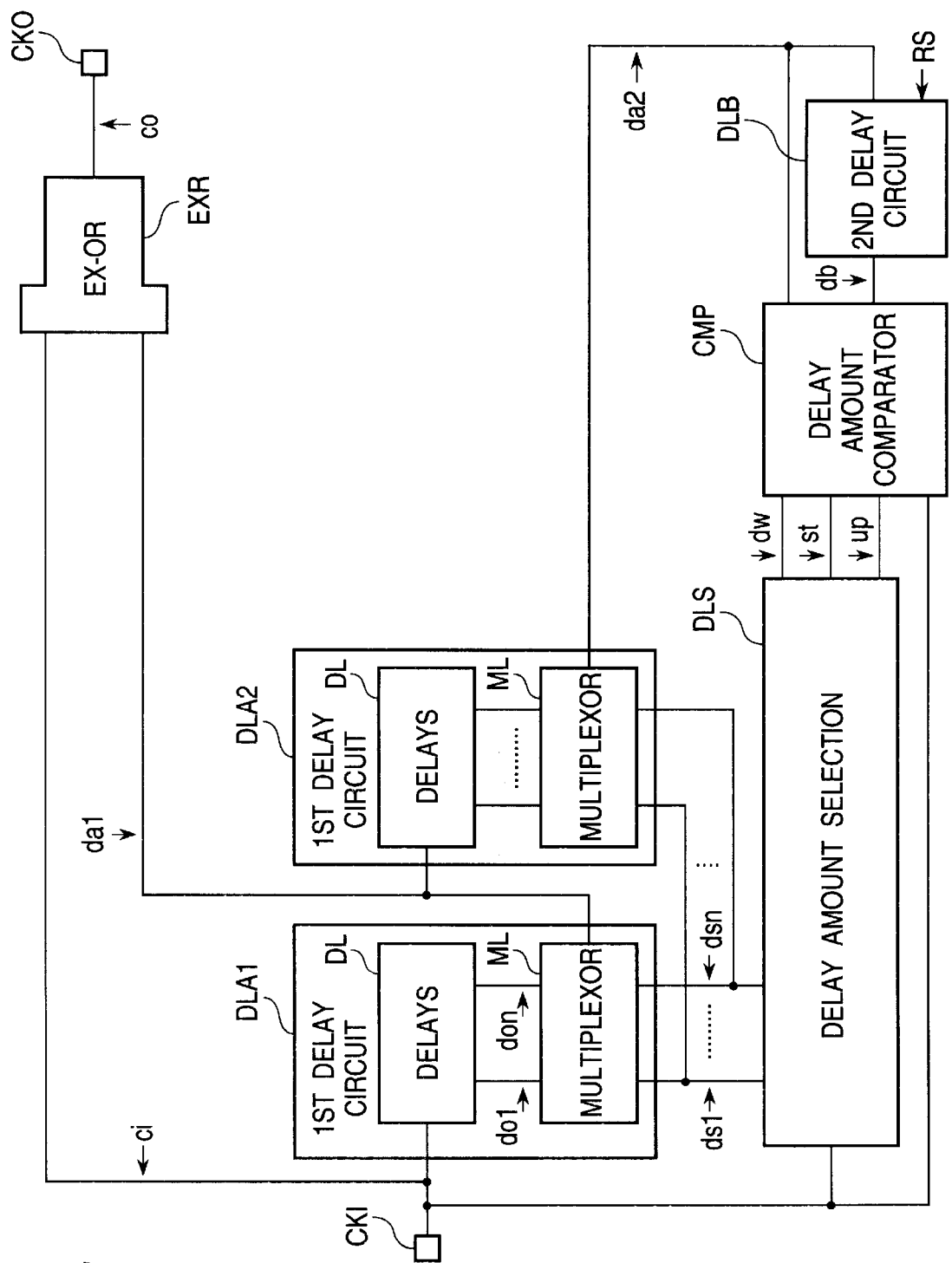
FIG. 1 is a block diagram of a frequency-doubling circuit which is a first embodiment of the frequency-multiplying circuit in accordance with the present invention.

Referring to FIG. 1, there is shown a block diagram of a frequency-doubling circuit which is a first embodiment of the frequency-multiplying circuit in accordance with the present invention.

The shown frequency-doubling circuit includes two cascaded sages DLA1 and DLA2 of a first delay circuit, a first stage DLA1 receiving an input signal "ci" to be frequency-doubled, through an input terminal CKI. The input signal "ci" on the input terminal CKI and a delayed signal "da1" outputted from the first stage DLA1 of the first delay circuit, are supplied to an EX-OR circuit EXR, which has an output generating a frequency-doubled signal "co" to an output terminal CKO. Furthermore, the delayed signal outputted from the first stage DLA1 of the first delay circuit, is also supplied to a second stage DLA2 of the first delay circuit, which outputs a further delayed signal "da2" to a first input of a delay amount comparator CMP and an input of a second delay circuit DLB.

A delayed signal outputting terminal of the second delay circuit DLB is connected to a second input of the delay amount comparator CMP. A third input of the delay amount comparator CMP is connected to input terminal CKI to receive the input signal "ci" to be frequency-doubled.

The delay amount comparator CMP generates a delay amount decreasing signal "dw", a delay amount fixing signal "st" and a delay amount increasing signal "up" to a delay amount selector DLS, which has an input connected to input terminal CKI to receive the input signal "ci"; to be frequency-doubled.

The delay amount selector DLS generates selection control signals "ds1" to "dsn" to corresponding selection control terminals of the first and second stages DLA1 and DLA2 of the first delay circuit The first stage DLA1 of the first delay circuit includes a group of delays DL for delaying the input signal "ci" by a predetermined time, and a multiplexor ML receiving delayed output signals "do1" to "don" which are outputted from the respective delays of the delay group DL and which have a delay time different from another. The multiplexor ML selects and outputs one of the received delayed output signals "do1" to "don" under control of the delay amount selector DLS. The second stage DLA2 of the first delay circuit has the same construction as that of the first stage DLA1 of the first delay circuit.

Figure 2:
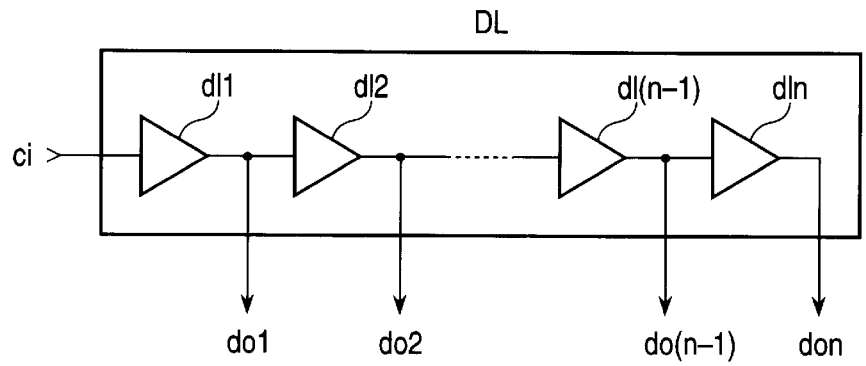
FIG. 2 is a circuit diagram of the group of delays DL incorporated in the frequency-doubling circuit shown in FIG. 1.

Referring to FIG. 2 which is a circuit diagram of the delay group DL incorporated in the first stage DLA1 of the first delay circuit, the delay group DL includes a number of cascaded delays "dl1" to "dln", each of which is constituted of a pair of cascaded inverters. An output of the respective delays "dl1" to "dln" generate the delayed output signals "do1" to "don" which are obtained by delaying the input signal "ci" one after another and which have a delay time different from another. Therefore, the delayed output signal "do1" has a minimum delay amount and the delayed output signal "don" has a maximum delay amount.

Figure 3:
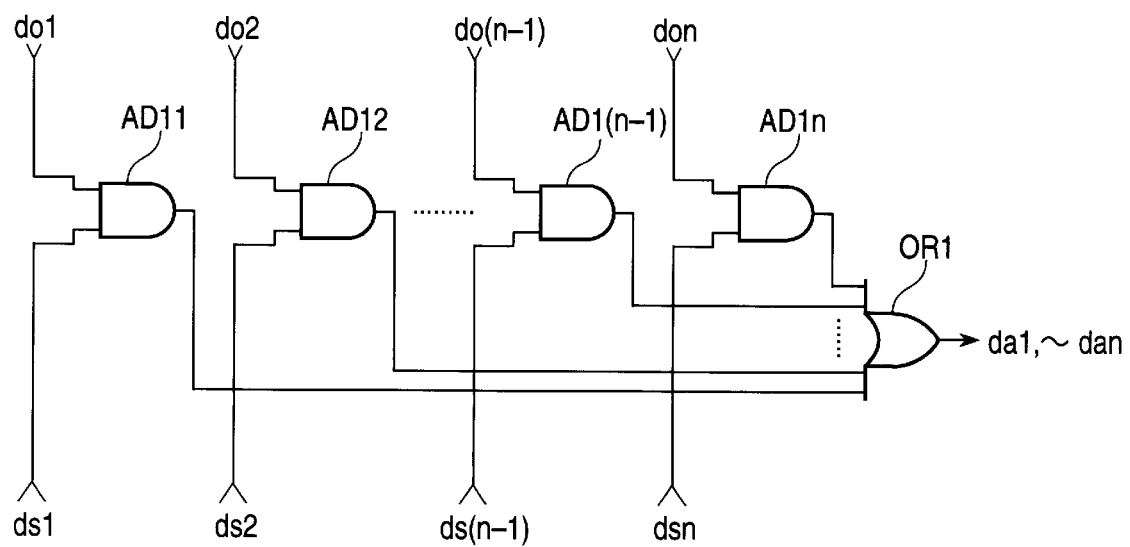
FIG. 3 is a circuit diagram of the multiplexor ML incorporated in the frequency-doubling circuit shown in FIG. 1.

Referring to FIG. 3 which is a circuit diagram of the multiplexor ML, the multiplexor ML includes "n" AND circuits ADl1 to ADln and a "n"-input OR circuit OR1 receiving respective outputs of the AND circuits ADl1 to AD1n. The AND circuit ADl1 receives the delayed output signal "do1" and the selection control signal "ds1", and the AND circuit ADl2 receives the delayed output signal "do2" and the selection control signal "ds2". Similarly, the AND circuit ADln receives the delayed output signal "don" and the selection control signal "dsn". Thus, an output of the OR circuit OR1 supplies a selected one of the delayed output signals "do1" to "don".

Figures 4, 8:
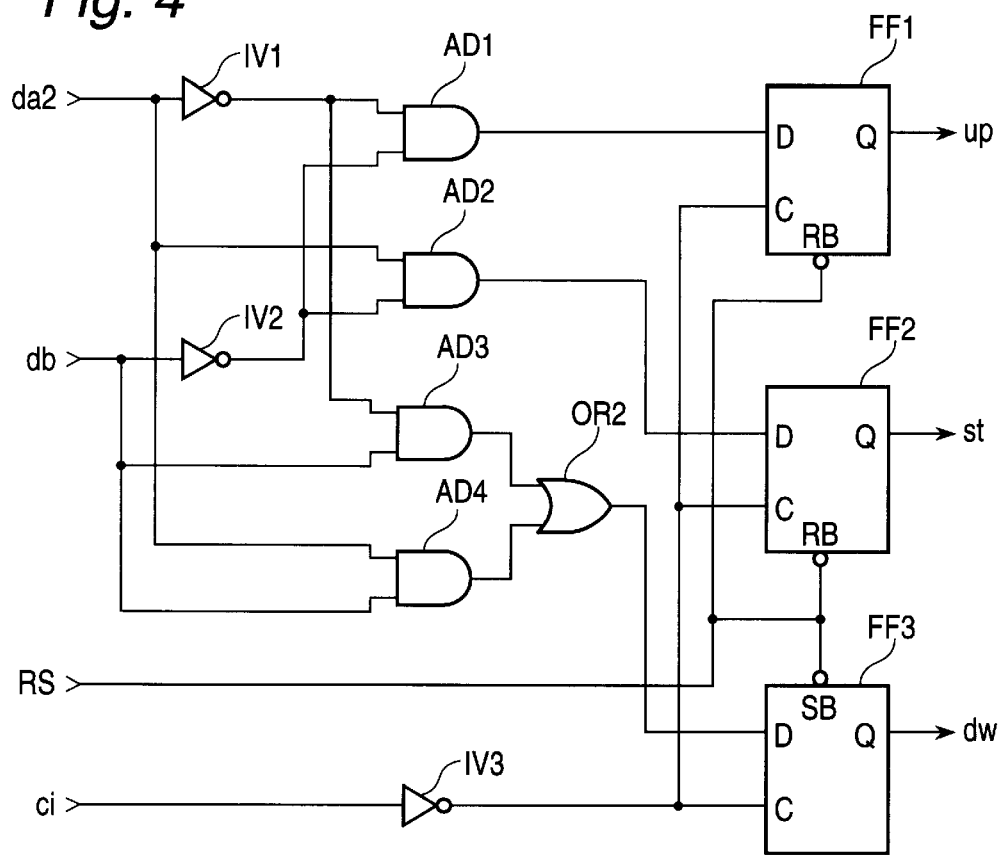
FIG. 4 is a circuit diagram of the delay amount comparator CMP incorporated in the frequency-doubling circuit shown in FIG. 1.
FIG. 8 is a truth table of the delay amount selector DLS, incorporated in the frequency-doubling circuit shown in FIG. 1.

The second delay circuit DLB is constituted of a delay having the same delay amount as that of at least the first delay of the first stage of the first delay circuit, although an internal construction of the second delay circuit DLB is not shown. In this embodiment, for example, the second delay circuit DLB is constituted of a delay equivalent to the delay dl1 of the delay group DL of the first stage DLA1 of the first delay circuit, Referring to FIG. 4 is a circuit diagram of the delay amount comparator CMP, the delay amount comparator CMP includes circuits for generating the delay amount increasing signal "up", the delay amount fixing signal "st" and the delay amount decreasing signal "dw", respectively. The delay amount increasing signal generating circuit includes an AND circuit AD1 having one input connected to an output of an inverter IV1 receiving the delayed output signal "da2", and the other input connected to an output of an inverter IV2 receiving the delayed output signal "db" of the second delay circuit DLB, and a flipflop FF1 having a data input D connected to an output of the AND circuit AD1 and a data output Q for generating the delay amount increasing signal "up".

The delay amount fixing signal generating circuit includes an AND circuit AD2 having one input connected to directly receive the delayed output signal "da2", and the other input connected to the output of an inverter IV2 receiving the delayed output signal "db" of the second delay circuit DLB, and a flipflop FF2 having a data input D connected to an output of the AND circuit AD1 and a data output Q for generating the delay amount fixing signal "st".

The delay amount decreasing signal generating circuit includes AND circuit AD3 having one input connected to the output of an inverter IV1 receiving the delayed output signal "da2", and the other input connected to directly receive the delayed output signal "db" of the second delay circuit DLB. An output of the AND circuit AD3 is connected to an input of an OR circuit OR2 having the other input of another AND circuit AD4, which has one input connected to directly receive the delayed output signal "da2", and the other input connected to directly receive the delayed output signal "db" of the second delay circuit DLB. An output of the OR circuit OR2 is connected to a data input D of a flipflop FF3 having a data output Q for generating the delay amount decreasing signal "dw".

A clock input C of each of these flipflops FF1, FF2 and FF3 is connected to receive through an inverter IV3 the input signal "ci" to be frequency-doubled. A reset input RB of the flipflops FF1 and FF2 and a set input SB of the flipflop FF3 are connected to receive a reset signal RS.

Referring to FIG. 5A, there is shown a circuit diagram of the delay amount selector DLS. FIG. 5B is a block diagram of the selector SL incorporated in the delay amount selector DLS, and FIG. 5D is a block diagram of the flipflop incorporated in the delay amount selector DLS. As seen from FIG. 5A, the delay amount selector DLS includes a number of cascaded selection circuits each of which is constituted of the selector SL, the flip flop FF and the AND circuit AD.

In each of the cascaded selection circuits, an output of an AND circuit AD91, AD92, . . . , or AD9n is connected to a scan input SCAN of the selector SLI, SL2, . . . , or SLn included in the same stage selection circuit. One input of the AND circuit (AD91, AD92, . . . , and AD9n) of each selection circuit, is connected to receive the delay amount decreasing signal "dw". The other input of the AND circuit (AD91, AD92, . . . , or AD9(n−1)) in the selection circuits excluding the final stage selection circuit, is connected to receive an output of the next stage selections circuit. Namely, the other input of the AND circuit AD91 is connected to receive the selection control signal "ds2", and the other input of the AND circuit AD9(n-1) is connected to receive the selection control signal "dlsn". The other input of the AND circuit AD9n of the final stage selection circuit, is grounded, namely, is fixed to "0". A selection input SEL of the selector (SL1, SL2, . . . , and SLn) of each selection circuit is connected to receive the delay amount increasing signal "up". A data input D of the selector SL1 of the first stage selection circuit is grounded, namely, is fixed to "0". A data input D of the selector (SL2, . . . , or SLn) of each of the selection circuits excluding the first stage selection circuit, is connected to an output of the preceding stage selection circuit, namely, the Q output of the flipflop of the preceding stage selection circuit.

In each of the cascaded selection circuits, an output of the selector (SL1, SL2, . . . , or SLn) is connected to a data input D of the flipflop (FF41, FF42, . . . , or FF4n) of the same stage selection circuit. The Q output of the flipflop of each selection circuit generates the selection control signal ("ds1", "ds2", . . . , or "dsn") and is connected to an input of the next stage selection circuit, namely, to the data input D of the selector of the next selection circuit. A clock input C of the flipflop of each selection circuit is connected to an output of an AND circuit AD10, which has one input connected to receive the input signal "ci" to be frequency-multiplied, and the other connected to an output of an inverter IV4 having an input connected to the delay amount fixing signal "st".

Now, an operation of the frequency-doubling circuit of the first embodiment will be described. First, an operation of each function block will be described.

The second delay circuit DLB has a function of further delaying the delayed output signal "da2" (outputted from the first delay circuit DLA composed of the "n" cascaded delays) by the same delay amount as that of the first stage delay of the delays constituting the delay group DL of the first stage first delay circuit DLA1.

Referring to the truth table of FIG. 6, the multiplexor ML receives the delayed signals "do1" to "don", and when one of the selection control signals "ds1" to "dsn" is brought to "1", the multiplexor ML selects the delayed signal corresponding to the selection control signal of "1", among the received delayed signals "do1" to "don". For example, when "ds1"=1 and "ds2" to "dsn"=0, the multiplexor ML selects and outputs the delayed signal "do1". Similarly, when "ds2"=1 and "ds1" and "ds3" to "dsn"=0, the multiplexor ML selects and outputs the delayed signal "do2". When "dsn"=1 and "ds1" to "ds(n−1)"=0, the multiplexor ML selects and outputs the delayed signal "don".

The delay amount comparator CMP compares the delayed output signal "da2" outputted from the second stage first delay circuit DLA1 with the further delayed output signal "db" outputted from the second delay circuit DLB, at a rising of the input signal "ci" to be frequency-divided. When the delay amount is small, the delay amount comparator CMP outputs the delay amount increasing signal "up" of "1", the delay amount fixing signal "st" of "0" and the delay amount decreasing signal "dw" of "0" to the delay amount selector DLS. When the delay amount is optimum, the delay amount comparator CMP outputs the delay amount fixing signal "st" of "1", the delay amount decreasing signal "dw" of "0" and the delay amount increasing signal "up" of "0", to the delay amount selector DLS. When the delay amount is large, the delay amount comparator CMP outputs the delay amount decreasing signal "dw" of "1", the delay amount fixing signal "st" of "0", and the delay amount increasing signal "up" of "0", to the delay amount selector DLS.

Referring to the truth table of FIG. 7, in an initial condition in which the reset signal RS=1, only the delay amount increasing signal "up" is of "1", and on the other hand, the delay amount decreasing signal "dw" and the delay amount fixing signal "st" are of "0", regardless of the input signal "ci" to be frequency-doubled and the delayed output signals "da2" and "db". When the reset signal RS=0, if both of the delayed output signals "da2" and "db" are "0" at a falling of an inverted signal of the input signal "ci" to be frequency-doubled, only the delay amount decreasing signal "dw" is brought into "1", and on the other hand, the delay amount fixing signal "st" and the delay amount increasing signal "group" are "0". If the delayed output signals "da2" and "db" are "1" and "0", respectively, only the delay amount fixing signal "st" is brought into "1", and on the other hand, the delay amount increasing signal "up" and the delay amount decreasing signal "dw" are "0". If both of the delayed output signals "da2" and "db" are "1", or if the delayed output signals "da2" and "db" are "0" and "1", respectively, only the delay amount increasing signal "up" is brought into "1", and on the other hand, the delay amount fixing signal "st" and the delay amount decreasing signal "dw" are "0".

Depending upon which of the delay amount decreasing signal "dw", the delay amount fixing signal "st" and the delay amount increasing signal "up" is "1", the delay amount selector DLS brings only one of the selection control signals "ds1" to "dsn" (supplied to the multiplexor of the first and second stages DLA2 and DLA2 of the first delay circuit) into "1" and also brings the other selection control signals into "0", thereby to determine the delay amount of each of the first and second stages DLA2 and DLA2 of the first delay circuit.

Referring to FIG. 5C, which is a truth table of the selector SL incorporated in the delay amount selector DLS, when the selection input SEL of the selector is "1", the selector outputs the signal inputted to the data input "D" to the output terminal Y, regardless of the signal applied to the scan input SCAN. When the selection input SEL of the selector is "1", the selector outputs the signal supplied to the scan input SCAN to the output terminal Y, regardless of the signal applied to the data input "D".

Referring to FIG. 8, which is a truth table of the delay amount selector DLS mentioned above, in the status number "1", at a rising of the input signal "ci" to be frequency-doubled, when the delay amount decreasing signal "dw" is "1", and the delay amount fixing signal "st" and the delay amount increasing signal "up" are "0", only the selection control signal "dsn" is brought into "1".

In the status number "2", at the rising of the input signal "ci" to be frequency-doubled, when the delay amount decreasing signal "dw" is "1" again, and the delay amount fixing signal "st" and the delay amount increasing signal "up" are "0", only the selection control signal "ds(n−1)", which is at a place higher than that of the selection control signal "dsn", is : brought into "1".

Assuming that this condition in which the delay amount decreaing signal "dw" is "1" and the delay amount fixing signal "st" and the delay amount increasing signal "up" are "0", continues until the status number "(n−2)", at the rising of the input signal "ci" to be frequency-doubled in the status number "(n−2)", only the selection control signal "ds1" at the highest place is brought into "1".

In the status number "(n−1)", at the rising of the input signal "ci" to be frequency-doubled, if the delay amount increasing signal "up" is "1" and the delay amount fixing signal "st" and the delay amount decreasing signal "dw" are "0", only the selection control signal "ds2", which is at a place lower than the selection control signal "ds1", is brought into "1".

In the status number "n", at the rising of the input signal "ci" to be frequency-doubled, if the delay amount fixing signal "st" is "1" and the delay amount increasing signal "up" and the delay amount decreasing signal "dw" are "0", the selection control signals "ds1" to "dsn" maintain the respective preceding conditions.

The EX-OR circuit EXR executes the exclusive-OR operation between the input signal "ci" to be frequency-doubled and the delayed output signal "da1" outputted from the first stage first delay circuit DLA1, so as to output the frequency-doubled signal "co" to the output terminal CKO.

On the basis of the above mentioned function operations of the respective function blocks, the operation of the frequency-doubling circuit will be described with reference to FIGS. 1 to 8 and also with reference to FIGS. 9, 10 and 11, which are timing charts for illustrating different operation conditions of the frequency-doubling circuit shown in FIG. 1.

Figure 9:
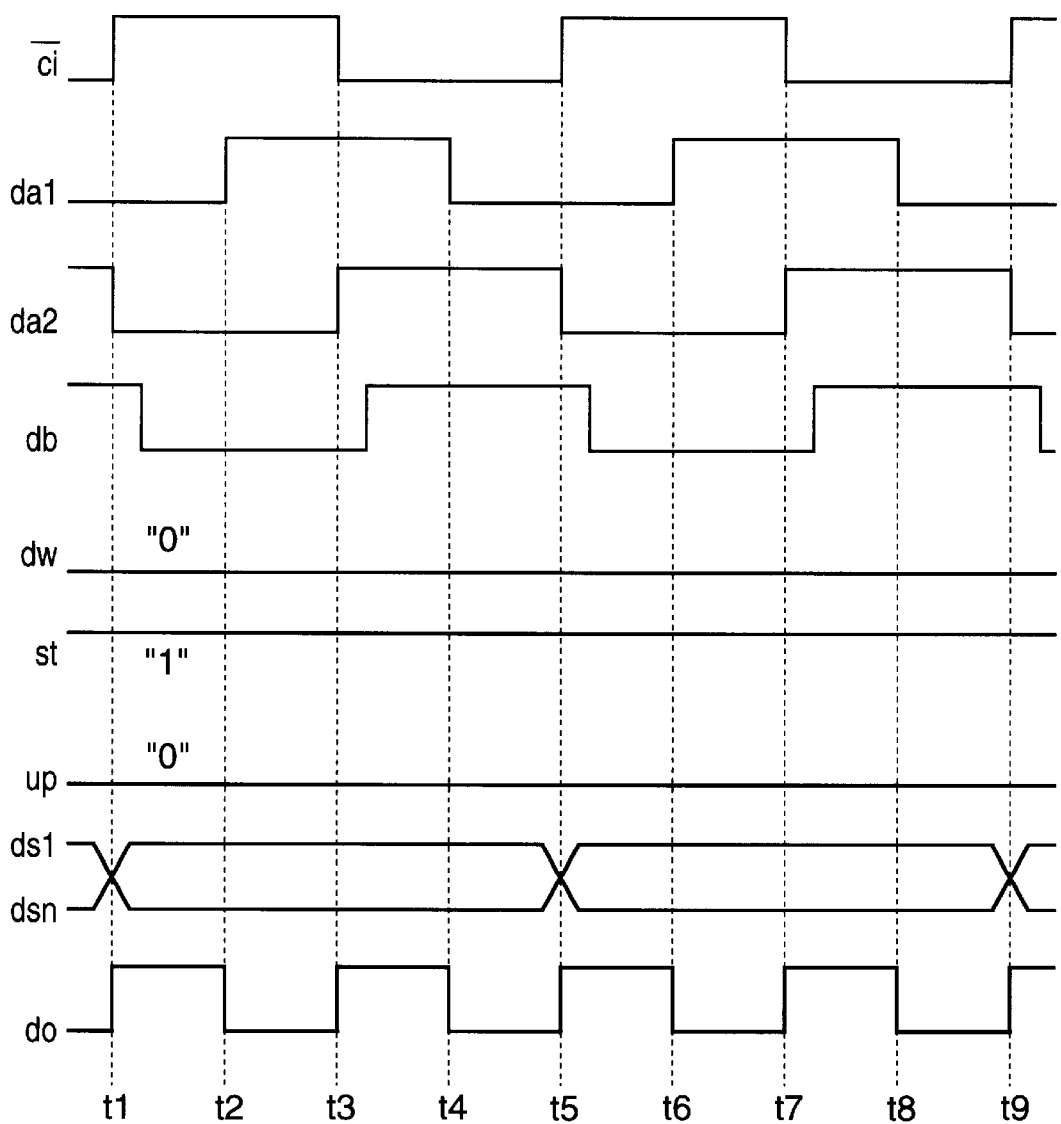
FIG. 9 is a timing chart for illustrating an operation condition of the frequency-doubling circuit shown in FIG. 1.

Referring to FIGS. 2 and 3 and also to FIG. 9 which is a timing chart for illustrating the operation of the frequency-doubling circuit when the selected delay amount is optimum, the input signal "ci" to be frequency-doubled is delayed by the delays "dl1" to "dln" of the first stage first delay circuit DLA1, so that the delayed output signals "do1" to "don" are outputted from the delays "dl1" to "dln" to the multiplexor ML of the first stage first delay circuit DLA1. In the multiplexor ML, one of the delayed output signals "do1" to "don" which becomes "1" as the logical product with the corresponding selection control signal "ds1" to "dsn", is outputted from the OR circuit OR1.

Thus, the delayed signal "da1" which is delayed from the timing "t1" of the rising of the inverted signal of the input signal "ci" to be frequency-doubled, to the timing "t2", is outputted from the first stage. first delay circuit DLA1. Here, the period from the timing "t1" to the timing "t2" is ½ of the period from the timing "t1" to the timing "t3" in which the input signal "ci" to be frequency-doubled is at "1". The delayed signal "da1" is also delayed in the second stage delay circuit DLA2, and outputted as the delayed signal "da2" which is selected by the selection control signal "ds1" to "dsn", similarly to the first stage first delay circuit DLA1.

This delayed signal "da2" is supplied to the delay amounts comparator CMP and the second delay circuit DLB. In the second delay circuit DLB, the delayed signal "da2" is delayed by one delay having the same delay amount as that of the delay "dl1" in the first delay circuit DLA, and the delayed output signal "db" outputted from the second delay circuit DLB is supplied to the delay amount comparator CMP.

As mentioned above, the delay amount comparator CMP generates three status signals of the delay amount increasing signal "up", the delay amount decreasing signal "dw" and the delay amount fixing signal "st" in accordance with the truth table of FIG. 6. Here, the optimum condition is that the delay amount increasing signal "up" and the delay amount decreasing signal "dw" are "0" and the delay amount fixing signal "st" is "1".

Returning to FIG. 4, when both the delayed output signal "db" outputted from the second delay circuit DLB and the delayed signal "da2" outputted from the second stage first delay circuit DLA1are "0", the inverted signals of these delayed signals become "1", and therefore, the output of the AND circuit AD1 becomes "1". This signal of "1" is latched in the flipflop FF1 at the falling of the input signal "ci" to be frequency-multiplied, since the input signal "ci" is inverted by the inverter IV3 and then supplied to the clock input C of the flipflop FF1. Therefore, the delay amount increasing signal "up" of "1" is outputted at the falling of the input signal "ci" ("t3", "t7" in FIG. 9).

When the delayed signal "da2" and the delayed output signal "db" are "1" and "0", respectively, the AND circuit AD2 receiving the delayed signal "da2" and the inverted signal of the delayed output signal "db", outputs "1", which is latched in the flipflop FF2 at the falling of the inputs signal "ci" to be frequency-multiplied. Therefore, the delay amount fixing signal "st" of "1" is outputted at the falling of the input signal "ci".

Similarly, when the delayed signal "da2" and the delayed output signal "db" are "0" and "1", respectively, the AND circuit AD3 receiving the inverted signal of the delayed signal "da2" and the delayed output signal "db", outputs "1". In addition, when both the delayed signal "da2" and the delayed output signal "db" are "1", the AND circuit AD4 directy receiving the delayed signal "da2" and the delayed output signal "db", outputs "1". The output signal of "1" from the AND circuit AD3 and the output signal of "1" from the AND circuit AD4 are latched through the OR circuit OR2 in the flipflop FF3 at the falling of the input signal "ci" to be frequency-multiplied. Therefore, the delay amount decreasing signal "dw" is outputted at the falling of the input signal "ci".

Namely, considering one period of the input signal "ci" to be frequency-doubled, the status of the delayed output signals "da2" and "db" are compared at the falling of the inverted signal of the input signal "ci" in four periods, namely, the period of the status number "1" before the timing "t3" where the delayed output signal da2 of the final stage (namely, second stage) first delay circuit DLA1 rises up (namely, in this period, both of "da2" and "db" are "0"), the period of the status nimble "2" from the rising timing "t3" to the moment the delayed output signal "db" of the second delay circuit DLB (having the delay amount corresponding to at least the delay amount of one of the delays "dl1" to "dln" in the first delay circuit) rises up (namely, in this period, "da2" is at "1" and "db" is "0"), the period of the status number "3" from the delayed output signal "db" rises up to the moment the delayed output signal "da2" falls down (namely, in this period, both of "da2" and "db" are "1"), and the period of the status number "4" from the moment the delayed output signal "da2" falls down to the moment the delayed output signal "db" falls down (namely, in this period, "da2" is at "0" and "db" is "1").

Figure 10:
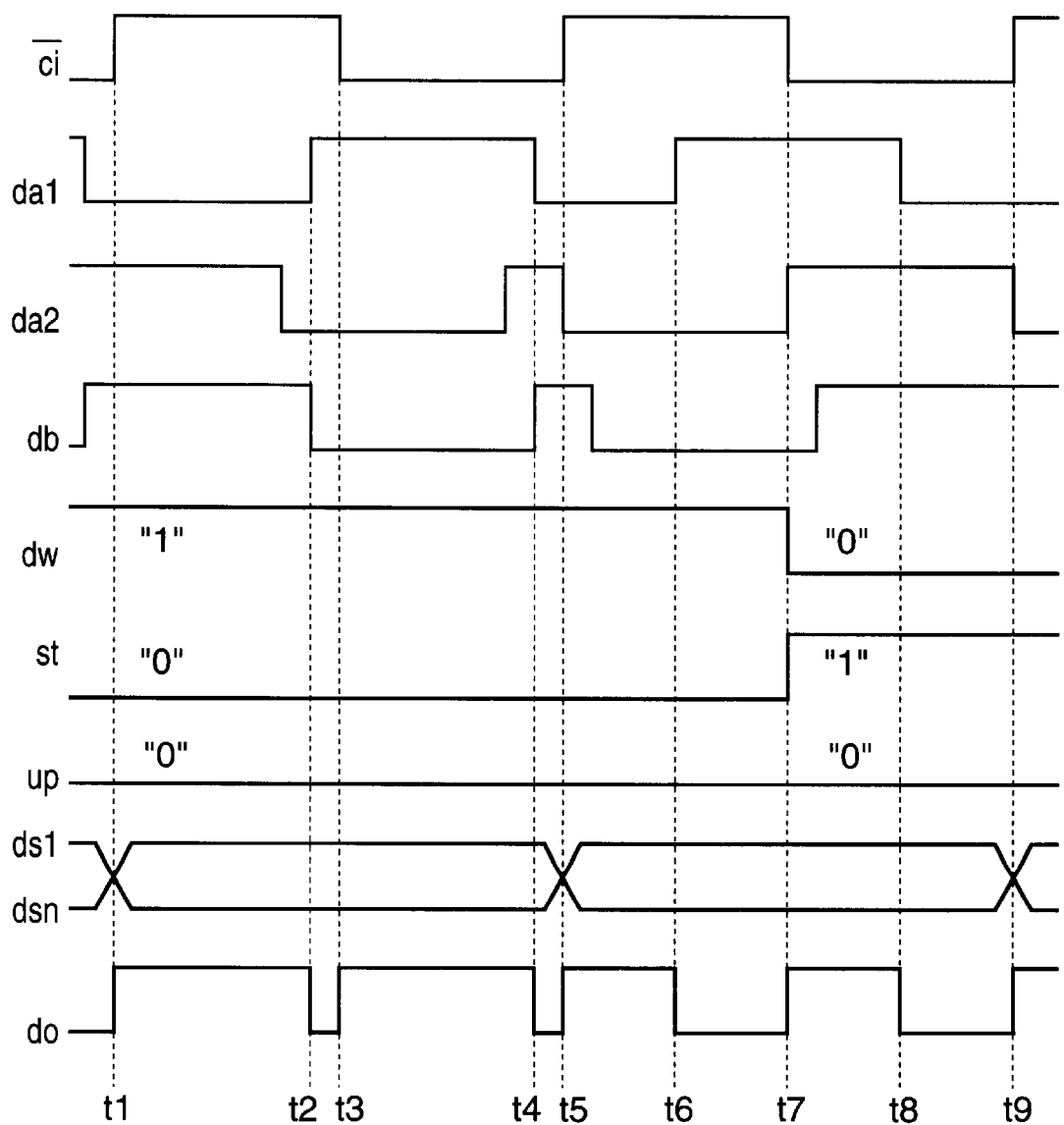
FIG. 10 is a timing chart for illustrating another operation condition of the frequency-doubling circuit shown in FIG. 1.

Referring to the truth table of FIG. 7 and FIG. 10 which is a timing chart for illustrating the operation of the frequency-doubling circuit when the delay amount is large, if the result of comparison indicates the status number "1", it is recognized at the falling timing "t3" of the input signal "ci" to be frequency-doubled, that the delay amount is large. At this the duty ratio of the frequency-doubled signal "do" deviates from the desired value to the condition in which the period of "1" is longer than the period of "0". On the basis of this recognition, the delay amount decreasing signal "dw" is brought to "1" to cause the delay amount selector DLS to make the delay amount small. As a result, in the period from "t3" to "t5", the control operation for adjusting the delay amount to the optimum value is carried out, and in the period after "t5", the frequency-doubled signal is optimized to have the duty ratio of 50%. Therefore, in synchronism with the falling timing "t7" of the next input signal "ci", the delay amount fixing signal "st" is brought into "1", so that the condition is maintained.

When the result of comparison indicates the status number "2", referring to FIG. 9, again, the delay amount is optimized, so that the frequency-doubled signal "do" has a normal duty ratio of 50% in which the period of "1" is equal to the period of "0". Therefore, the delay amount fixing signal "st" of "1" is outputted to control the delay amount selector DLS to maintain the condition at it is. As a result, in the period from "t3" to "t5", the control operation for adjusting the delay amount to the optimum value is carried out to maintain the preceding condition, and in the period after "t5", frequency-doubled signal is maintained in the optimized condition. Therefore, the delay amount fixing signal "st" is maintained at "1" in synchronism with the falling timing "t7" of the next input signal "ci".

Figure 11:
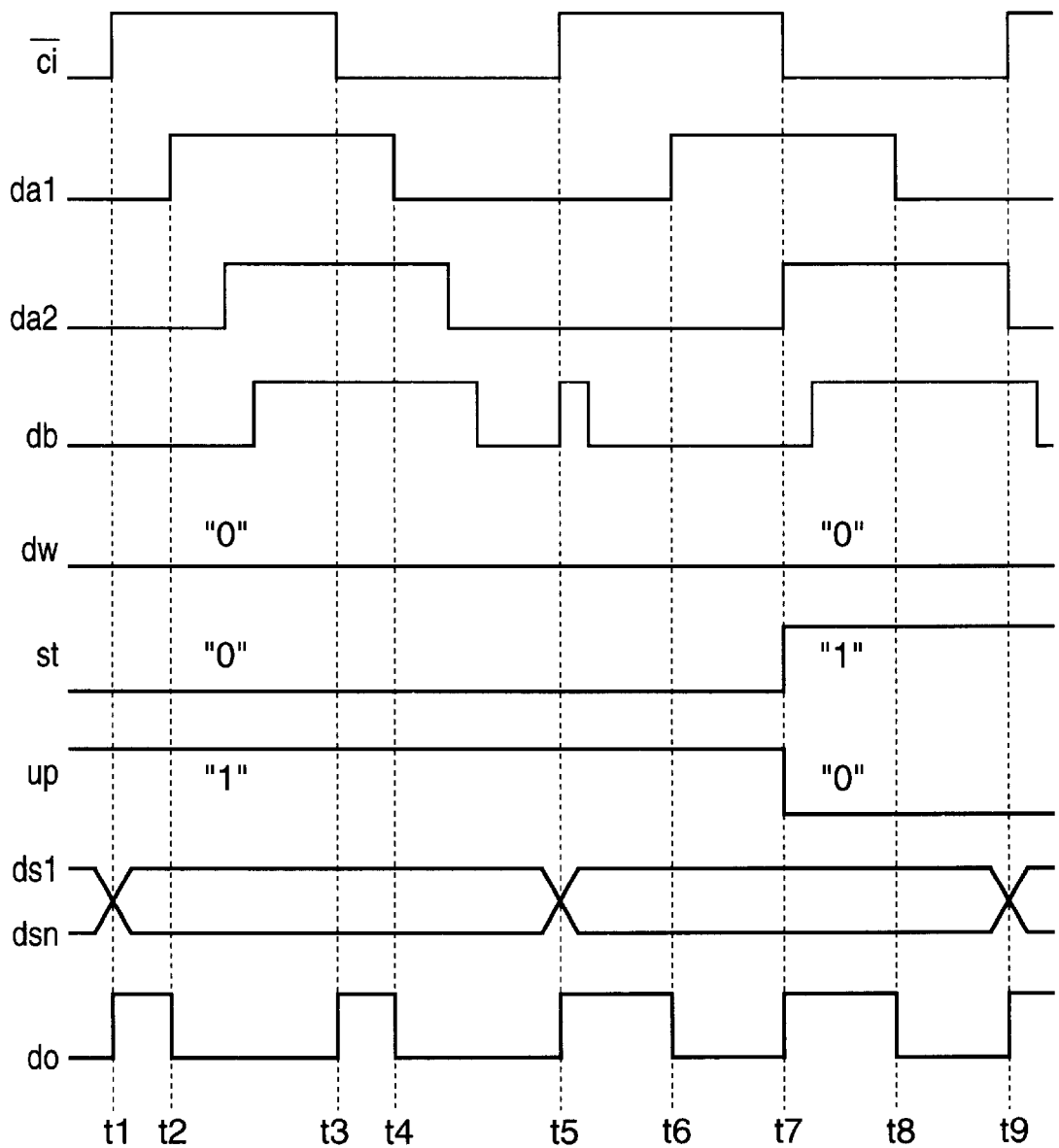
FIG. 11 is a timing chart for illustrating still another operation condition of the frequency-doubling circuit shown in FIG. 1.

When the result of comparison indicates the status number "3", referring to FIG. 11 which is a timing chart for illustrating the operation of the frequency-doubling circuit when the delay amount is small, the duty ratio of the frequency-doubled signal "do" deviates from the desired value to the condition in which the period of "1" is shorter than the period of "0". On the basis of this recognition, the delay amount increasing signal "up" is brought to "1" to cause the delay amount selector DLS to make the delay amount large. As a result, in the period from "t4" to "t5", the control operation for adjusting the delay amount to the optimum value is carried out, and in the period after "t5", the frequency-doubled signal is optimized to have the duty ratio of 50%. Therefore, in synchronism with the falling timing "t7" of the next input signal "ci", the, delay amount fixing signal "st" is brought into "1", so that the condition is maintained Although not shown, the status number "4" is a condition in which the status number "1" is further advanced. For example, because to many delays are cascaded in the delay circuits DLA, the total delay amount is too large, with the result that the duty ratio of the frequency-doubled signal "do" deviates greatly so that the period of "1" is further longer than the period of "0". In this case, the delay amount decreasing signal "dw" is brought to "1" to cause the delay amount selector DLS to make the delay amount small.

Referring to FIGS. 5 and 8, again, the delay amount selector DLS receiving the delay amount decreasing signal "dw", the delay amount fixing signal "st" and the delay amount increasing signal "up", operates to control as follows:

In an initial condition of the status number "1" (corresponding to the status number "5" in FIG. 7), the reset signal RS is "1". Of the flipflops FF41 to FF4n receiving the reset signal RS, only the (n−1)th flipflop FF4(n−1) receives the reset signal RS at the set input SB thereof, and the (n−1)th flipflop FF4(n−1) is set to "1" and the other flipflops reset to "0". As a result, the selection control signal "ds(n−1)" of "1" is outputted.

Then, if the reset is released so that the reset signal RS is brought to "1", the delay amount comparator BLD outputs the delay amount increasing signal "up" of "1" and the delay amount decreasing signal "dw" and the delay amount fixing signal "st" of "0". Namely, it becomes the status number "1". In this condition, the delay amount increasing signal; "up" of "1" is supplied to the selection input SEL of the selectors SL1 to SLn. On the other hand, the input signal "ci" to be frequency-doubled is supplied to the flipflops FF41 to FF4n as the clock signal when the delay amount fixing signal "st" is "0". When the delay amount fixing signal "st" is "1", no clock signal is supplied to the flipflops FF41 to FF4n.

Referring to FIG. 5C showing the truth table of the selector SL, when the selection input SEL is "1", the signal supplied to the data input D is outputted from the output Y. Therefore, the output "1" of the flipflop FF4(n−1) set to "1" in the status number "0", is selected by the selector SLn, and latched in the flipflop FF4n at the next clock cycle, so that the selection control signal "dsn" of "1" is outputted. The other flipflops FF41 to FF4(n−1) maintain "0" since the output of the preceding selector SL is "0".

Thereafter, when the condition changes into the status number "2" in which the delay amount decreasing signal "dw" is "1" and the delay amount increasing signal "up" and the delay amount fixing signal "st" are "0", the delay amount decreasing signal "dw" of "1" is supplied to one input of the AND circuit AD9(n−1), and the output "1" of the flipflop FF4n holding the preceding condition is supplied to the other input of the AND circuit AD9(n−1), so that the logical product "1" is supplied to the scan input SCAN of the selector SLn−1. Since the selection input SEL of the selector SLn−1 receives the delay amount increasing signal "up" of "0", the selector SLn−1 selects "1" supplied to the scan input SCAN. Therefore, at the next clock cycle, the flipflop FF4(n−1) outputs the selection control signal "ds(n−1) of "1".

At each time the delay amount decreasing signal "dw" of "1" is supplied, a leftward shift operation is repeated in the delay amount selector DLS, so that "1" is sequentially transferred to the flipflop FF4(n−2), . . . , FF41. Thus, in the status number (n−3), the selection control signal "ds2" of "1" is outputted, and in the status number (n−2), the selection control signal "ds1" of "1" is outputted.

In the status number (n−1), the delay amount increasing signal "up" of "1" is outputted, and the delay amount fixing signal "st" and the delay amount decreasing signal "dw" are brought to "0", so that "1" is supplied to the selection input SEL of the selectors SL1 to SLn. On the other hand, since the delay amount decreasing signal "dw" supplied to the one input of the AND circuits AD91 to AD9n is "0", the logic product becomes "0", so that the scan input SCAN of all the selectors SL1 to SLn is set to "0". Therefore, all the selectors SL1 to SLn output the signal on the data input D to the output Y.

Here, since the data input D of the selector SL1 is fixed to "0", the flipflop FF41 outputs the selection control signal "ds1" of "0" at the next clock cycle. On the other hand, since the data input D of the selector SL2 receives the signal "1" of the status number "1" held in the flipflop PF41, the flipflop FF42 outputs the selection control signal "ds2" of "1" at the next clock cycle.

Similarly, during a period in which the delay amount increasing signal "up" is "1", a rightward shift operation is repeated in the delay amount selector DLS at each cycle, so that "1" is sequentially transferred to the flipflop FF43, . . . m FF4n. At an (n−1)th rightward shift operation, the selection control signal "ds(n−1) is brought to "1", and at an (n)th rightward shift operation, the selection control signal "dsn is brought to "1".

The status number "n" indicates the optimum condition in which the delay amount is optimized by the delay amount adjustment and the delay amount comparator CM outputs the delay amount fixing signal "st" of "1". As mentioned above, since the one input of the AND circuit AD10 receives the inverted signal of the delay amount fixing signal "st" from the inverter IV4, the output of the AND circuit AD10 is fixed to "0", so that no clock signal is supplied to the flipflops FF41 to FF4n. Therefore, these flipflops FF41 to FF4n continue to maintain the preceding condition.

As mentioned above, whether or not the delay amount is optimum is detected by the delay amount comparator CMP on the basis of the delayed output signal "da2" outputted from the final stage of the first delay circuits DLA, and any one of the delay amount increasing signal "up", the delay amount fixing signal "st" and the delay amount decreasing signal "dw" is activated on the basis of the detection, so that the delay amount selector DLS functions as a shift register having a leftward shifting function and a rightward shifting function. For example, when the delay amount increasing signal "up" is active, in order to increase the delay amount, "1" is sequentially shifted rightward to sequentially and alternatively activate the selection control signals "ds1" to "dsn" in the direction from a small delay amount to a large delay amount. When the delay amount decreasing signal "dw" is active, "1" is sequentially shifted leftward to sequentially and alternatively activate the selection control signals "ds1" to "dsn" in the direction from a large delay amount to a small delay amount. Thus, the delay amount of the first delay circuits DLA1 and DLA2 is modified to give the optimum delay amount.

Thus, the output of the multiplexor ML of the first stage first delay circuit ADLA1 having the delay amount as mentioned above, is supplied together with the input signal "ci" to the EX-OR circuit EXR, which generates the frequency-doubled signal "co" having the duty ratio of 50%.

Figure 12:
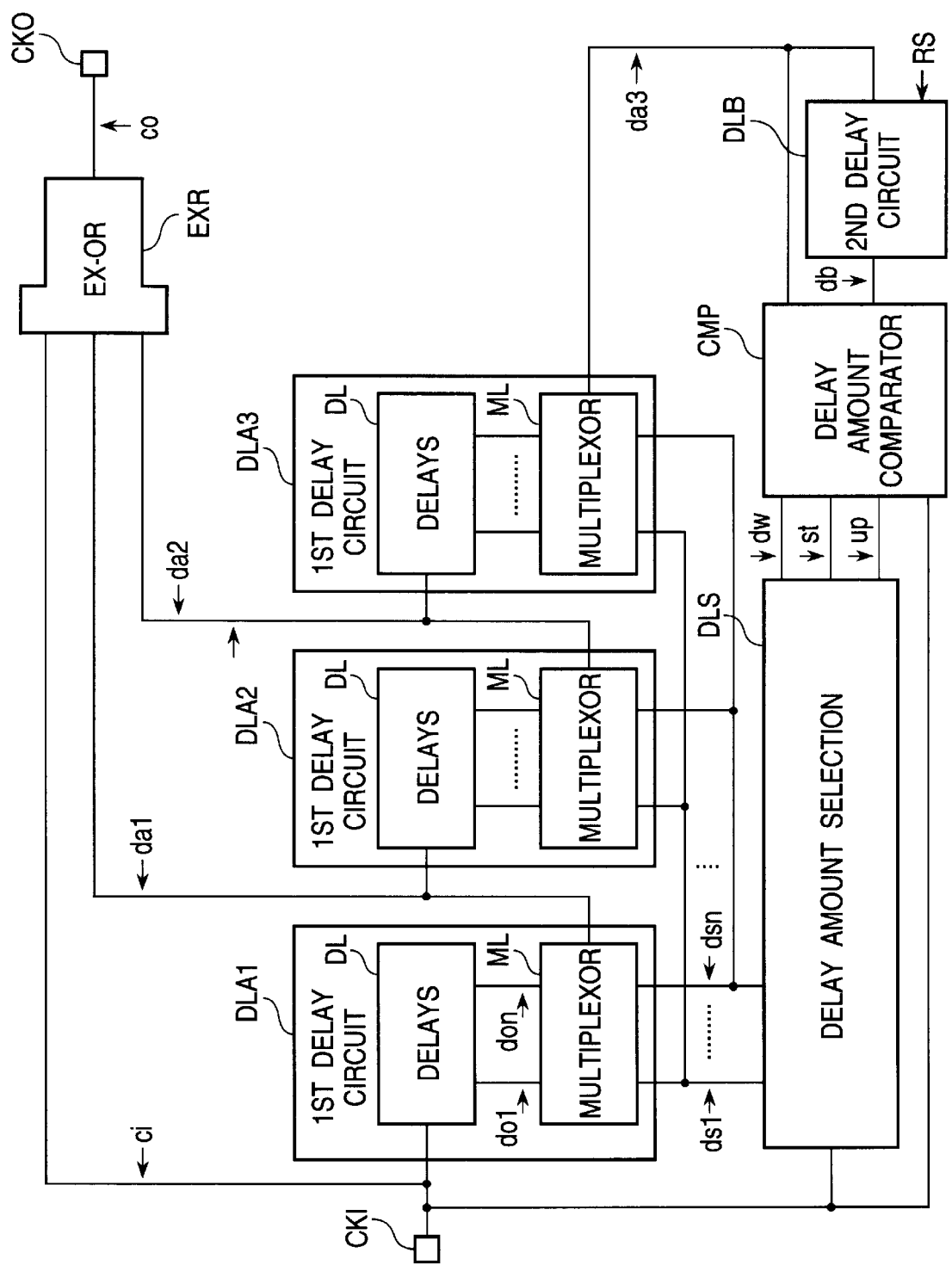
FIG. 12 is a block diagram of a frequency-tripling circuit which is a modification of the first embodiment of the frequency-multiplying circuit in accordance with the present invention.

Now, referring to FIG. 12, there is shown a block diagram of a frequency-tripling circuit which is a modification of the first embodiment of the frequency-multiplying circuit in accordance with the present invention. This frequency-tripling circuit is different from the frequency-doubling circuit shown in FIG. 1, in that three first delay circuits DLA1, DLA2 and DLA3 having the same construction are cascaded, and a delayed output signal "da3" of the third stage first delay circuit DLA3 is supplied to the second delay circuit DLB and the delay amount comparator CMP, in that the EX-OR circuit EXR is a three-input EX-OR circuit receiving the input signal "ci" to be frequency-multiplied, and delayed output signals "da1" and "da2" of the first and second stage first delay circuits DLA1 and DLA2, and in that the selection control signals "ds1" to "dsn" of the delay amount selector DLS are supplied in common to the selection signal inputs of respective multiplexors ML of the three first delay circuits DLA1, DLA2 and DLA3. The other construction is the same as that shown in FIG. 1, and therefore, explanation will be omitted for simplification of the description. In addition, the operation should be understood similarly, by reading the delayed output signal "da2" in the frequency-doubling circuit, as delayed output signal "da3".

Namely, the delay amount comparator CMP compares the delayed output signal "da3" of the third stage first delay circuit DLA3 and the delayed output signal "db" of the second delay circuit DLB at a rising timing of the input signal "ci" to be frequency-multiplied (at the falling timing of the inverted signal of the input signal "ci" outputted from the inverter IV3 within the delay amount comparator CMP). When the delay amount is small, the delay amount comparator CMP outputs the delay amount decreasing signal "dw" of "0", the delay amount fixing signal "st" of "0" and the delay amount increasing signal "up" of "1" to the delay amount selector DLS. When the delay amount is optimum, the delay amount comparator CMP outputs the delay amount decreasing signal "dw" of "0", the delay amount fixing signal "st" of "1" and the delay amount increasing signal "up" of "0" to the delay amount selector DLS. When the delay amount is large, the delay amount comparator CMP outputs the delay amount decreasing signal "dw" of "1", the delay amount fixing signal "st" of "0" and the delay amount increasing signal "up" of "0" to the delay amount selector DLS.

On the basis of which of the delay amount decreasing signal "dw", the delay amount fixing signal "st" and the delay amount increasing signal "up" is "1", the delay amount selector DLS activates the selected one of the selection control signals "ds1" to "dsn" (which are supplied to the selection signal inputs of the respective multiplexors ML of the three first delay circuits DLA1, DLA2 and DLA3) to "1", and the other selection control signals to "0", thereby to determine the delay amount. The input signal "ci" to be frequency-multiplied, and the delayed output signals "da1" and "da2" of the first and second stage first delay circuits DLA1 and DLA2 of the three cascaded first delay circuits DLA1, DLA2 and DLA3, are supplied to the EX-OR circuit EXR, so that the output signal "co" is outputted to the output terminal CKO.

In this operation, the delay amount of the three first delay circuits DLA1, DLA2 and DLA3 becomes the same, and therefore, the delayed output signal "da1" is delayed in phase from the input signal "ci" by the same delay amount, and the delayed output signal "da2" is delayed in phase from the delayed output signal "da1" by the same delay amount. Therefore, the output signal "co" outputted from the EX-OR circuit EXR becomes a frequency-tripled output signal having the pulse width which corresponds to the delay amount of each of the three first delay circuits DLA1, DLA2 and DLA3 and which is one third of the pulse width of the input signal "ci".

Figure 13:
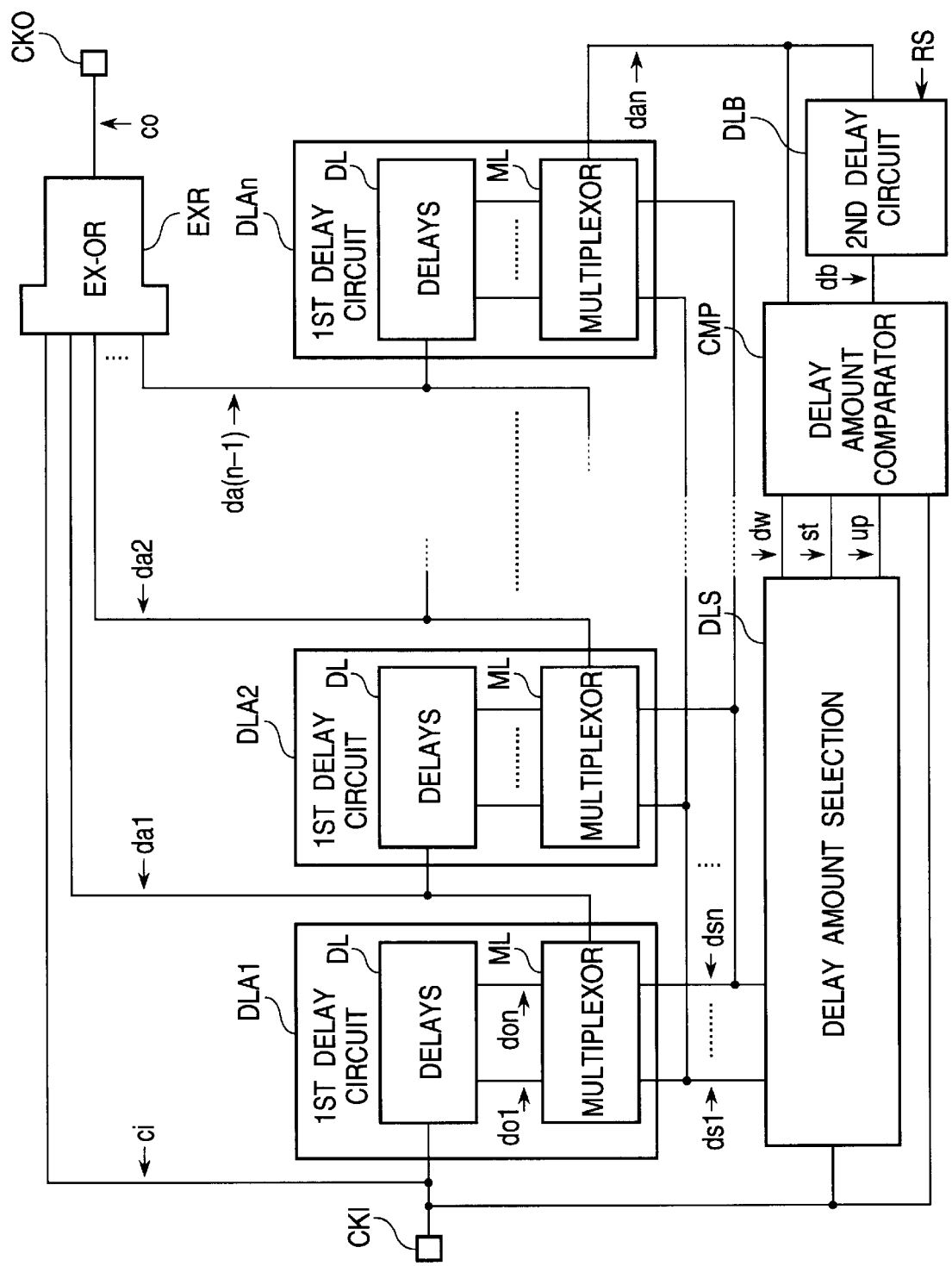
FIG. 13 is a block diagram of a "n"-time frequency-multiplying circuit which is another modification of the first embodiment of the frequency-multiplying circuit in accordance with the present invention.

Next, referring to FIG. 13, there is a block diagram of a "n"-time frequency-multiplying circuit which is another modification of the first embodiment of the frequency-multiplying circuit in accordance with the present invention. This frequency-multiplying circuit is different from the frequency-doubling circuit shown in FIG. 1, in that "n" first delay circuits DLA1 to DLAn having the same construction are cascaded, and a delayed output signal "dan" of the (n)th stage first delay circuit DLAn is supplied to the second delay circuit DLB and the delay amount comparator CMP, in that the EX-OR circuit EXR is an n-input EX-OR circuit receiving the input signal "ci" to be frequency-multiplied, and delayed output signals "da1" to "da(n−1)" of the first to (n−1)th stage first delay circuits DLA1 to DLA(n−1), and in that the selection control signals "ds1" to "dsn" of the delay amount selector DLS are supplied in common to the selection signal inputs of respective multiplexors ML of the "n" first delay circuits DLA1 to DLAn. The other construction is the same as that shown in FIG. 1, and therefore, explanation will be omitted for simplification of the description. In addition, the operation should be understood similarly, by reading the delayed output signal "da2" in the frequency-doubling circuit, as delayed output signal "dan".

Namely, the delay amount comparator CMP compares the delayed output signal "dan" of the (n)th stage first delay circuit DLAn and the delayed output signal "db" of the second delay circuit DLB at the falling timing of the inverted signal of the input signal "ci" to be frequency multiplied. When the delay amount is small, the delay amount comparator CMP outputs the delay amount decreasing signal "dw" of "0", the delay amount fixing signal "st" of "0" and the delay amount increasing signal "up" of "1" to the delay amount selector DLS. When the delay amount is optimum, the delay amount comparator CMP outputs the delay amount decreasing signal "dw" of "0", the delay amount fixing signal "st" of "1" and the delay amount increasing signal "up" of "0" to the delay amount selector DLS. When the delay amount is large, the delay amount comparator CMP outputs the delay amount decreasing signal "dw" of "1", the delay amount fixing signal "st" of "0" and the delay amount increasing signal "up" of "0" to the delay amount selector DLS.

On the basis of which of the delay amount decreasing signal "dw", the delay amount fixing signal "st" and the delay amount increasing signal "up" is "1", the delay amount selector DLS activates the selected one of the selection control signals "ds1" to "dsn" (which are supplied teethe selection signal inputs of the respective multiplexors ML of the three first delay circuits DLA1, DLA2 and DLA3) to "1", and the other selection control signals to "0", thereby to determine the delay amount. The input signal "ci" to be frequency-multiplied, and the delayed output signals "da1" to "da(n−1)" of the first to (n−1)th stage first delay circuits DLA1 to DLA(n−1) of the "n" cascaded first delay circuits DLA1 to DLAn, are supplied to the EX-OR circuit EXR, so that the frequency-multiplied output signal "co" is outputted to the output terminal CKO.

In this operation, the delay amount of the "n" first delay circuits DLA1 to DLAn becomes the same, and therefore, the delayed output signal "da1" is delayed in phase from the input signal "ci" by the same delay amount, and the delayed output signal "da2" is delayed in phase from the delayed output signal "da1" by the same delay amount, and so on. Therefore, the output signal "co" outputted from the EX-OR circuit EXR becomes a frequency-multiplied-by-"n" output signal having the pulse width which corresponds to the delay amount of each of the "n" first delay circuits DLA1 to DLAn and which is 1/n of the pulse width of the input signal "ci".

As mentioned above, by cascading a necessary number of first delay circuits DLA in accordance with a required degree of frequency multiplication, a necessary digital frequency multiplying circuit can be realized.

Figure 14:
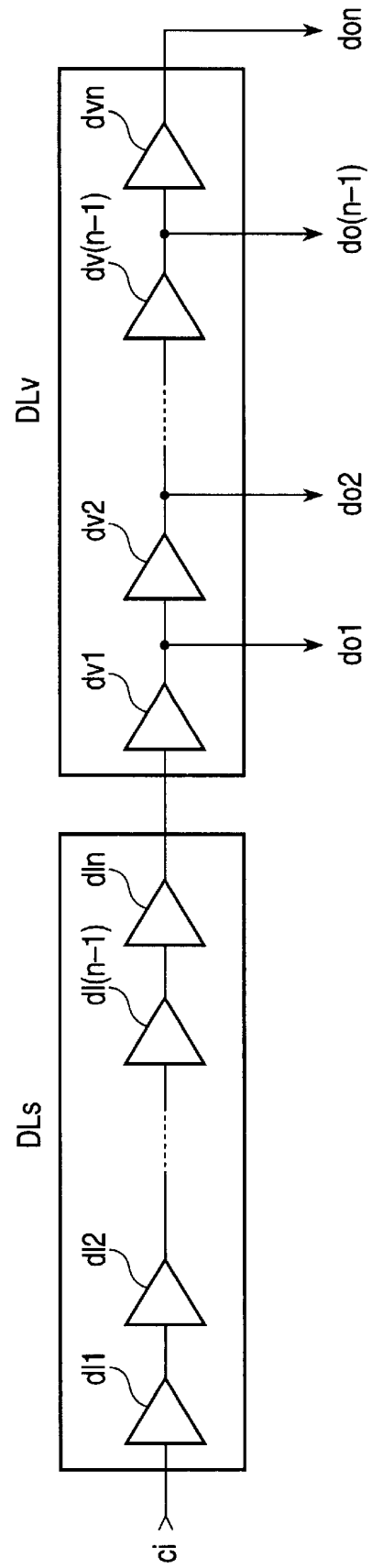
FIG. 14 is a circuit diagram of a modification of the group of delays DL.

Referring to FIG. 14, there is shown a circuit diagram of a modification of the delay group DL used in the first embodiment. This modification includes a fixed delay group DLs and a variable delay group DLv connected in cascade.

The fixed delay group DLs includes a plurality of cascaded unitary delays "dl1", "dl2", . . . , "dl(n−1) and "dln", and the variable delay group DLv includes a plurality of cascaded unitary delays "dv1", "dv2", . . . , "dv(n−1) and "dvn". An output of the final stage unitary delay "dln" is connected to an input of the first stage unitary delay "dv1" of the variable delay group DLv. The cascaded unitary delays "dv1", "dv2", . . . , "dv(n−1) and "dvn" of the variable delay group DLv output "n" delayed output signals "do1", "do2", . . . , "do(n−1) and "don", respectively, which are supplied to the multiplexor ML. In this example, the delay amount can be made large, and on the other hand, the delay amount can be finely adjusted.

Figure 15:
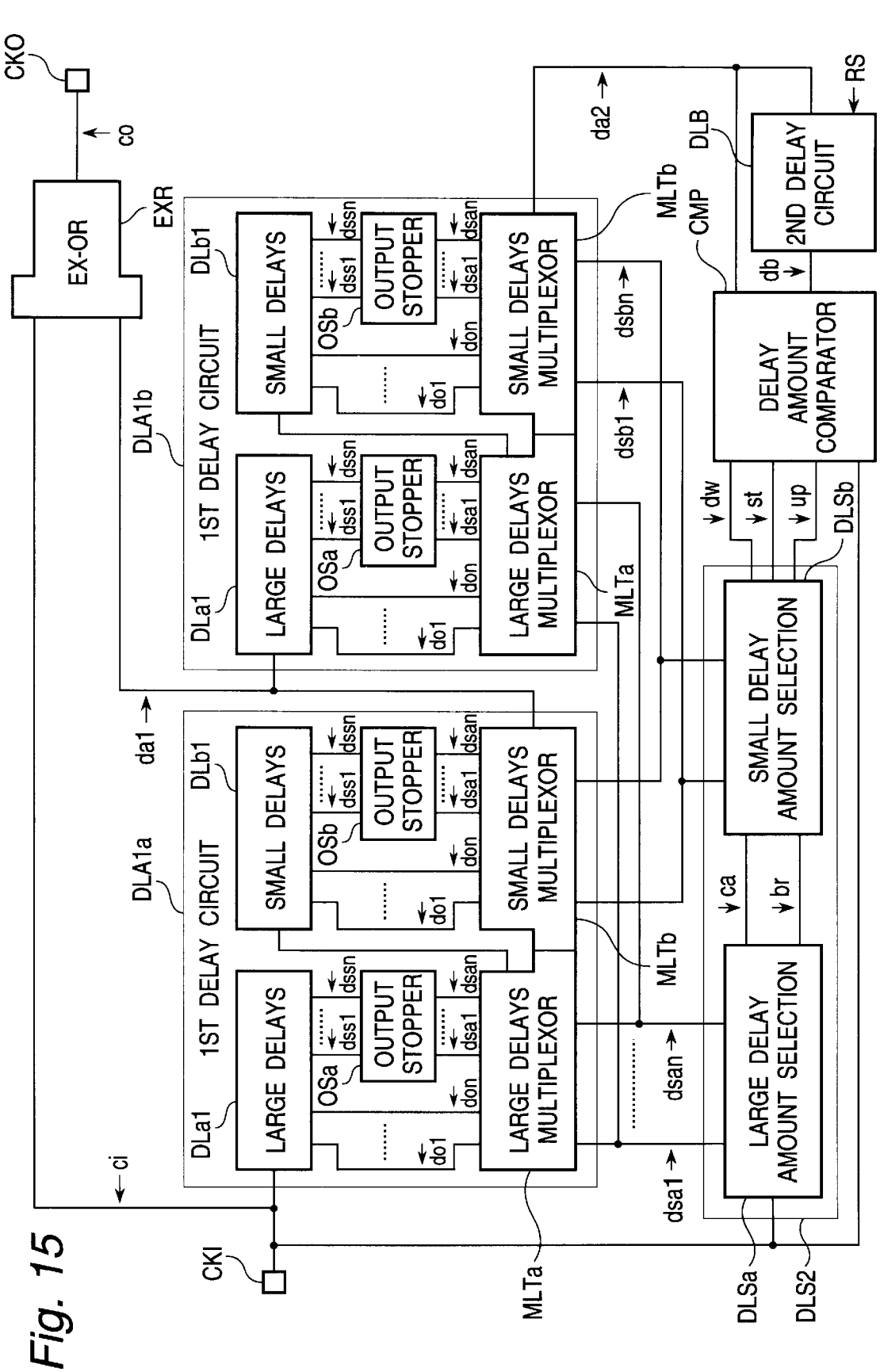
FIG. 15 is a block diagram of a second embodiment of the frequency-multiplying circuit in accordance with the present invention.

Referring to FIG. 15, there is shown a block diagram of a second embodiment of the digital frequency-multiplying circuit in accordance with the present invention. In FIG. 15, element corresponding to those shown in FIG. 1 are given the same Reference Numerals and Signs, and explanation thereof will be omitted for simplification of the description.

The shown digital frequency-multiplying includes two cascaded stages DLA1$a$ and DLA1$b$ of a first delay circuit, a first stage DLA1$a$ receiving an input signal "ci" to be frequency-multiplied, through an input terminal CKI. The input signal "ci" on the input terminal CKI and a delayed signal "da1" outputted from the first stage DLA1 of the first delay circuit, are supplied to an EX-OR circuit EXR, which has an output generating a frequency-multiplied signal "co" to an output terminal CKO. Furthermore, the delayed signal outputted from the first stage DLA1$a$ of the first delay circuit, is also supplied to a second stage DLA1$b$ of the first delay circuit, which outputs a further delayed signal "da2" to a first input of a delay amount comparator CMP and an input of a second delay circuit DLB. The first stage DLA1a and the second stage DLA1$b$ of the first delay circuit have the same construction and therefore gives the same delay amount under control of a delay amount selector DLS2.

The first stage first delay circuit DLA1 includes a large delay group DLa1 composed of a plurality of cascaded delays each having a relatively large predetermined delay amount, an output stopper OSa for stopping the operation of non-selected delays of the delays included in the large delay group DLa1, a large delay multiplexor MLTa receiving delayed output signals "do1" to "don" from the large delay group DLa1 for outputting a selected one of the delayed output signals "do1" to "don", a small delay group DLb1 composed of a plurality of cascaded delays each having a relatively small predetermined delay amount, an output stopper OSb for stopping the operation of non-selected delays of the delays included in the small delay group DLb1, a small delay multiplexor MLTb receiving delayed output signals "do1" to "don" from the small delay group DLb1 for outputting a selected one of the delayed output signals "do1" to "don".

Figure 16A:
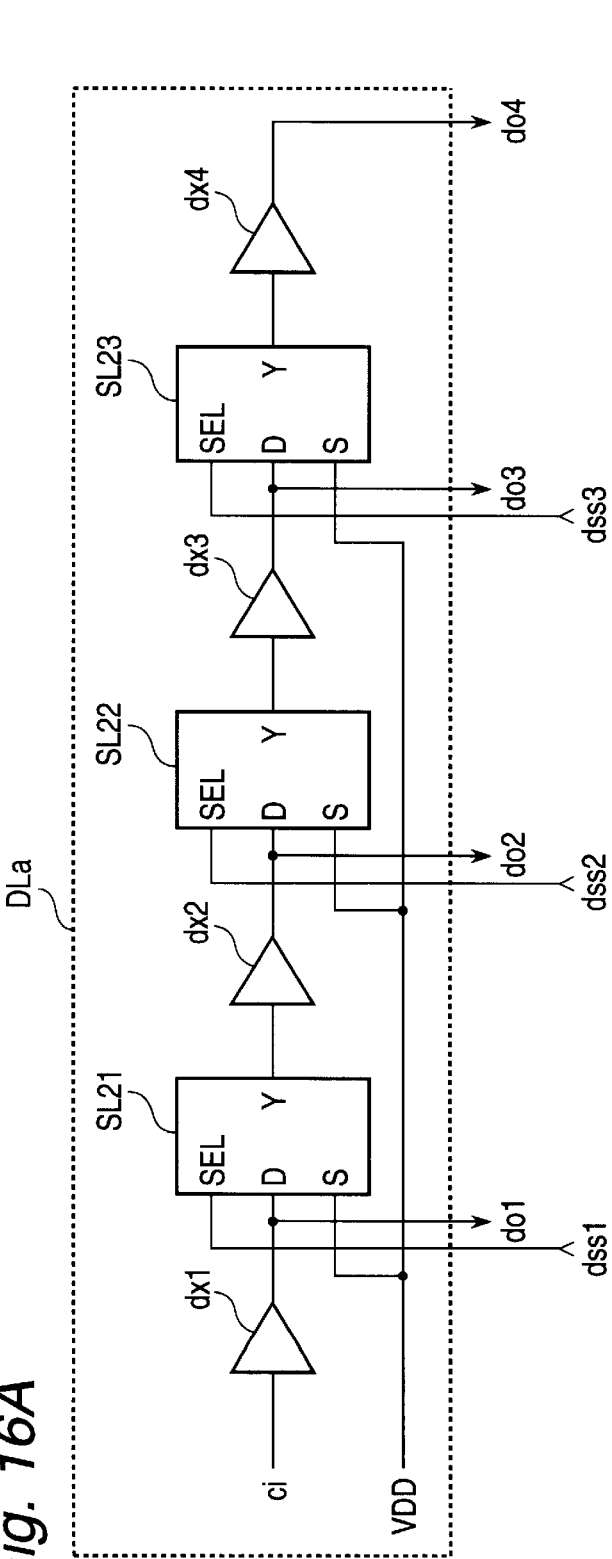
FIG. 16A is block diagram illustrating the construction of four stages in the large delay group DLa incorporated in the frequency-multiplying circuit shown in FIG. 15.

Referring to FIG. 16A which is a block diagram illustrating the construction of four stages in the large delay group DLa1, the large delay group DLa1 includes a large delay "dx1" having a relatively large predetermined delay amount, an input of which is connected to receive the input signal "si" to be frequency-multiplied. To an output of large,, delay "dx1", selectors SL21, SL22 and SL23 having an input D and an output Y and large delays "dx2", "dx3" and "dx4" are alternately cascaded. Selection inputs SEL of the selectors SL21, SL22 and SL23 are connected to receive selection stop signals "dss1", "dss2" and "dss3", respectively. An S input of each of the selectors SL21, SL22 and SL23 is fixed to "1" (VDD). An output of the delays "dx1", "dx2", "dx3" and "dx4" output the delayed output signals "do1", "do2", "do3" and "do4", respectively, which are obtained by sequentially delaying the input signal "ci" to be frequency-multiplied. Namely, the delayed output signal "do1" has a minimum delay amount, and the delayed output signal "don" (namely, the delayed output signal "do4" in the example shown in FIG. 16A) has a maximum delay amount.

Since the small delay group DLb1 has the same construction as that of the large delay group DLa1, excepting that each of unitary delays included in the small delay group DLb1 has the delay amount smaller than that of each of the unitary delays "dx1" to "dxn" included in the large delay group DLa1, explanation will be omitted.

Referring to FIG. 16B, there is a block diagram of the output stopper OSa, which corresponds to the four stages in the large delay group DLa1 shown in FIG. 16A. The shown portion of the output stopper OSa includes three EX-OR circuits EXR1, EXR2 and EXR3 having one input fixed to "0" (ground) and other inputs connected to receive selection control signals "dsa1", "dsa2" and "dsa3", respectively. The EX-OR circuits EXR1, EXR2 and EXR3 output the selection stop signals "dss1", "dss2" and "dss3", respectively, which are supplied to the SEL input of the selectors SL21, SL22 and SL23 in the large delay group DLa1, respectively.

Input terminals of the output stopper OSa for receiving the selection control signals "dsa1" to "dsan" are connected to corresponding output terminals of the large delay multiplexor MLTa. On the other hand, the delayed output signals of the large delay group DLa1 are supplied to corresponding input terminals of the large delay multiplexor MLTa. A selection output of the large delay multiplexor MLTa is connected to an input signal terminal of the small delay group DLb1.

Input terminals of the small delay group DLb1 for receiving the selection stop signals "dss1" to "dssn" are connected to corresponding output terminals of the output stopper OSb. Input terminals of the output stopper OSb for receiving the selection control signals "dsa1" to "dsan" are connected to corresponding output terminals of the small delay multiplexor MLTb. On the other hand, the delayed output signals of the small delay group DLb1 are supplied to corresponding input terminals of the small delay multiplexor MLTb. A selection output of the small delay multiplexor MLTb outputs the delayed output signal "da1".

Since the output stopper OSb is constructed similarly to the output stopper OSa, explanation will be omitted.

The large delay multiplexor MLTa is constructed similarly to the multiplexor ML shown in FIG. 3 and mentioned hereinbefore, but have wiring lines for bypassing the selection control signals "dsa1 " to "dsan" to the output stopper OSa.

As mentioned above, the delayed output signal "da2" of the second stage DLA1b of the cascaded first delay circuits is supplied to the delay amount comparator CMP and the second delay circuit DLB. This second delay circuit DLB is constructed to have the same delay amount of at least large delay "dx1" in the first stage first delay circuit DLA1a.

The further delayed output signal "db" outputted from the second delay circuit DLB is supplied to the delay amount comparator CMP, which has a timing input connected to the input terminal CK1 for receiving the input signal "ci" to be frequency-multiplied.

The delay amount comparator CMP is similar to the delay amount comparator CMP of the first embodiment, and therefore, generates the delay amount increasing signal "up", the delay amount fixing signal "st" and the delay amount decreasing signal "dw", which are supplied to the small delay amount selector DLSb of the delay amount selector DLS2. This small delay amount selector DLSb has a clock input connected to the input terminal CKI for the input signal "ci" to be frequency-multiplied.

The delay amount selector DLS2 includes the small delay amount selector DLSb and the large delay amount selector DLSa. A plurality of delay amount control signals "dsb1" to "dsbn" generated in the small delay amount selector DLSb supplied to the corresponding input terminals of the small delay multiplexor MLTb of each of the first and second stage first delay circuits DLA1a and DLA1b, respectively. The small delay amount selector DLSb is configured to generate a small delay amount selection carry signal "ca" and a small delay amount selection borrow signal "br" to corresponding input terminals of the large delay amount selector DLSa. The large delay amount selector DLSa generates the selection control signals "dsa1" top "dsan" to the corresponding input terminals of the large delay multiplexor MLTa of each of the first and second stage first delay circuits DLA1a and DLA1b, respectively.

An operation of this second embodiment is similar to that of the first embodiment, excepting for an operation of the output stopper. Namely, whether or not the delay amount is optimum is detected by the delay amount comparator CMP on the basis of the delayed output signal "da2" outputted from the final stage of the cascaded first delay circuits, and any one of the delay amount increasing signal "up", the delay amount fixing signal "st" and the delay amount decreasing signal "dw" is activated on the basis of the detection, so that the delay amount selector DLS2 functions as a well-known up-down counter for carrying out an up-count operation to sequentially and alternatively activate the selection control signals "dsb1" to "dsbn" to "1" in the direction from a small delay amount to a large delay amount when the delay amount increasing signal "up" is active.

At this time, the up-count is started from the small delay amount selector DLSb, so that the selection control signals "dsb1" to "dsbn" are supplied to the small delay multiplexor MLTb to increase the delay amount. When the delay amount is still small, the small delay amount selection carry signal "ca" is generated to count up the large delay amount selector DLSa, so that the selection control signals "dsa1" to "dsan" are supplied to the large delay multiplexor MLTa to increase the delay amount.

When the delay amount decreasing signal "dw" is active, the delay amount selector DLS2 functions to carry out a down-count operation to sequentially and alternatively activate the selection control signals "dsb1" to "dsbn" to "1" in the direction from a large delay amount to a small delay amount when. In this case, the down-count is started from the small delay amount selector DLSb. When the delay amount is still large, the small delay amount selection borrow signal "br" is generated to count down the large delay amount selector DLSa, so that the selection control signals "dsa1" to "dsan" are supplied to the large delay multiplexor MLTa to decrease the delay amount. As a result, the delay amount is optimized.

In the above mentioned delay amount modifying operation, of the cascaded large delays "dx1" to "dxn", the delays from the first stage delay "dx1" to the delay outputting a selected delay amount are cascaded, and therefore, at each time the input signal "ci" repeats "1" and "0", a current flows through the cascaded delays. On the other hand, since the input of the non-selected large delays is fixed to "1" by the selection stop signal, no current flows through the non-selected large delays. Thus, since the operation of the large delays is selectively stopped, the current consumption can be reduced.

An operation of the output stopper OSa and the large delay group DLa in order to realize the above mentioned selective operation stopping, will now be described.

Referring to FIG. 16A showing the block diagram of the large delay group DLa, FIG. 16B showing the block diagram of the output stopper OSa, and FIG. 17 showing a truth table of the large delay group DLa, the selection control signals "dsa1" to "dsa3" are supplied to one input of EXR1 to EXR3 constituting the output stopper OSa, and the other input of EXR1 to EXR3 is fixed to "0".

When the input signal "ci" is "0", and only the selection control signal "dsa1" is "1" and the other selection control signal "dsa2" and "dsa3" are "0", the delayed output signal "do1" of the first stage large delay "dx1" is maintained at "0". Since only the selection control signal "dsa1" is "1", the output of EXR1 becomes "0", so that the SEL input of the selector SL21 is set to "0". The other EXR2 and EXR3 output "1", so that the SEL input of the selectors SL22 and SL23 is set to "1".

Figure 16C:
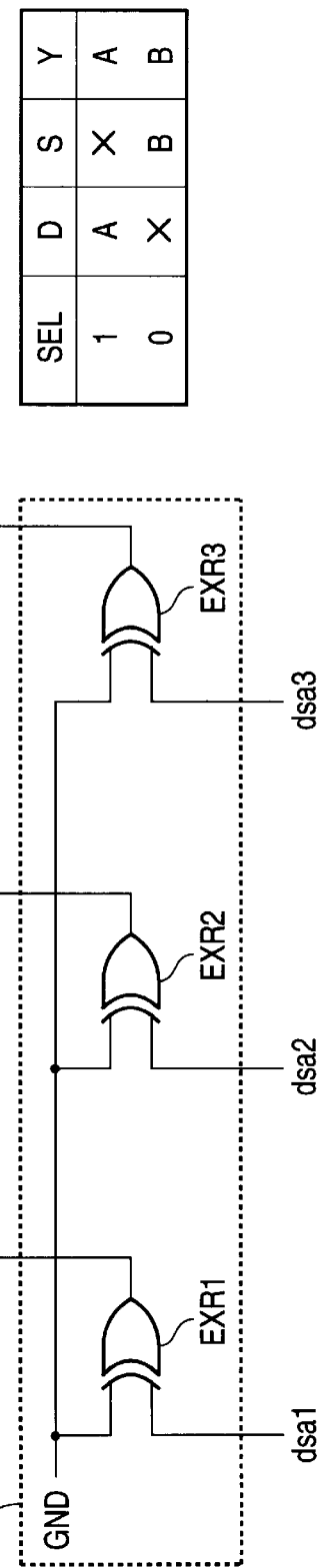
FIG. 16C is a truth table of the selector incorporated in the large delay group DLa.
Figure 18A:
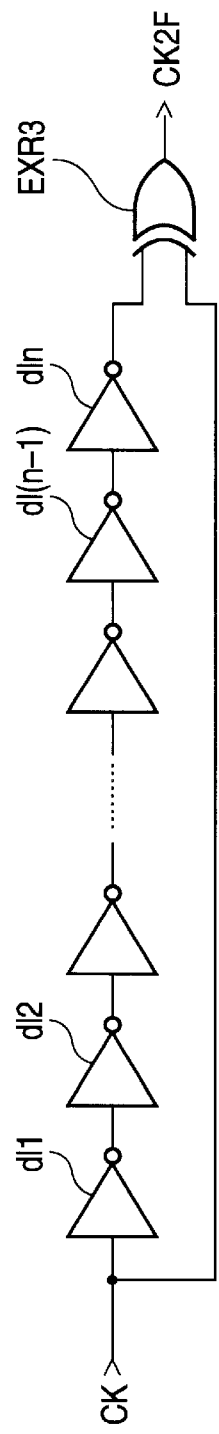
FIG. 18A is a logic circuit diagram of illustrating a general example of the prior art digital frequency multiplying circuit.
Figure 18B:
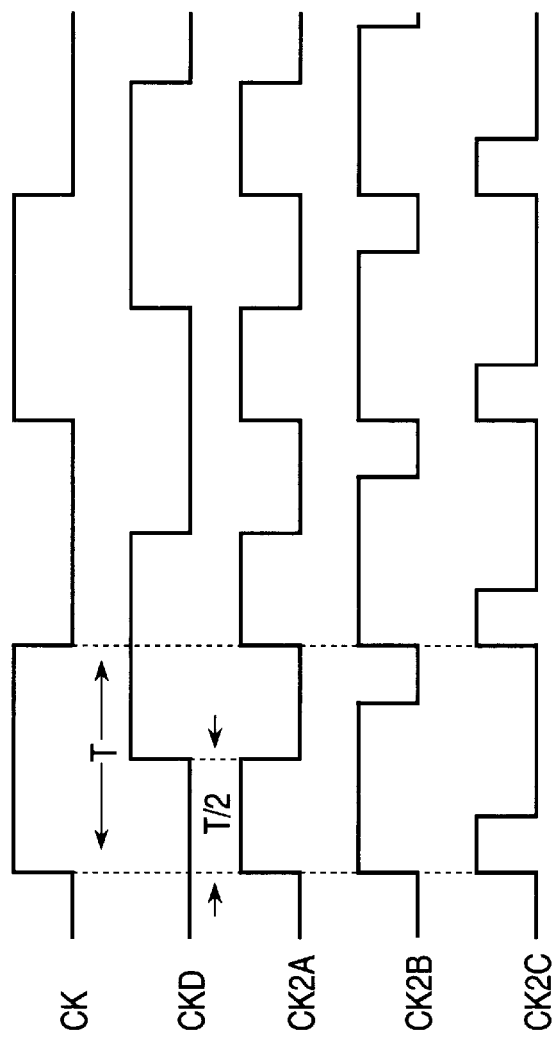
FIG. 18B is a timing chart illustrating an operation of the digital frequency multiplying circuit shown in FIG. 18A.
Figure 19:
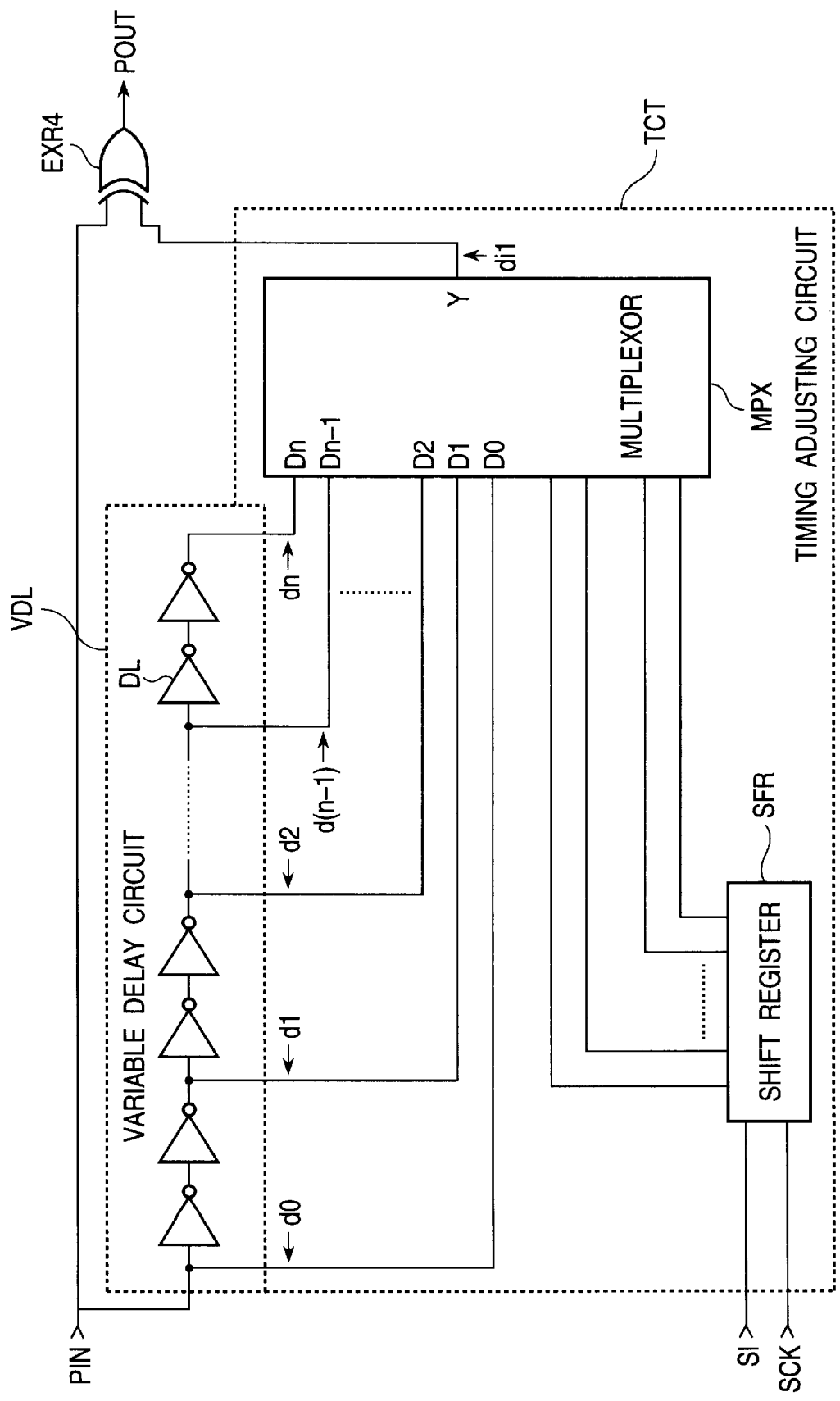
FIG. 19 is a logic circuit diagram of another example of the prior art digital frequency multiplying circuit.
Figure 20:
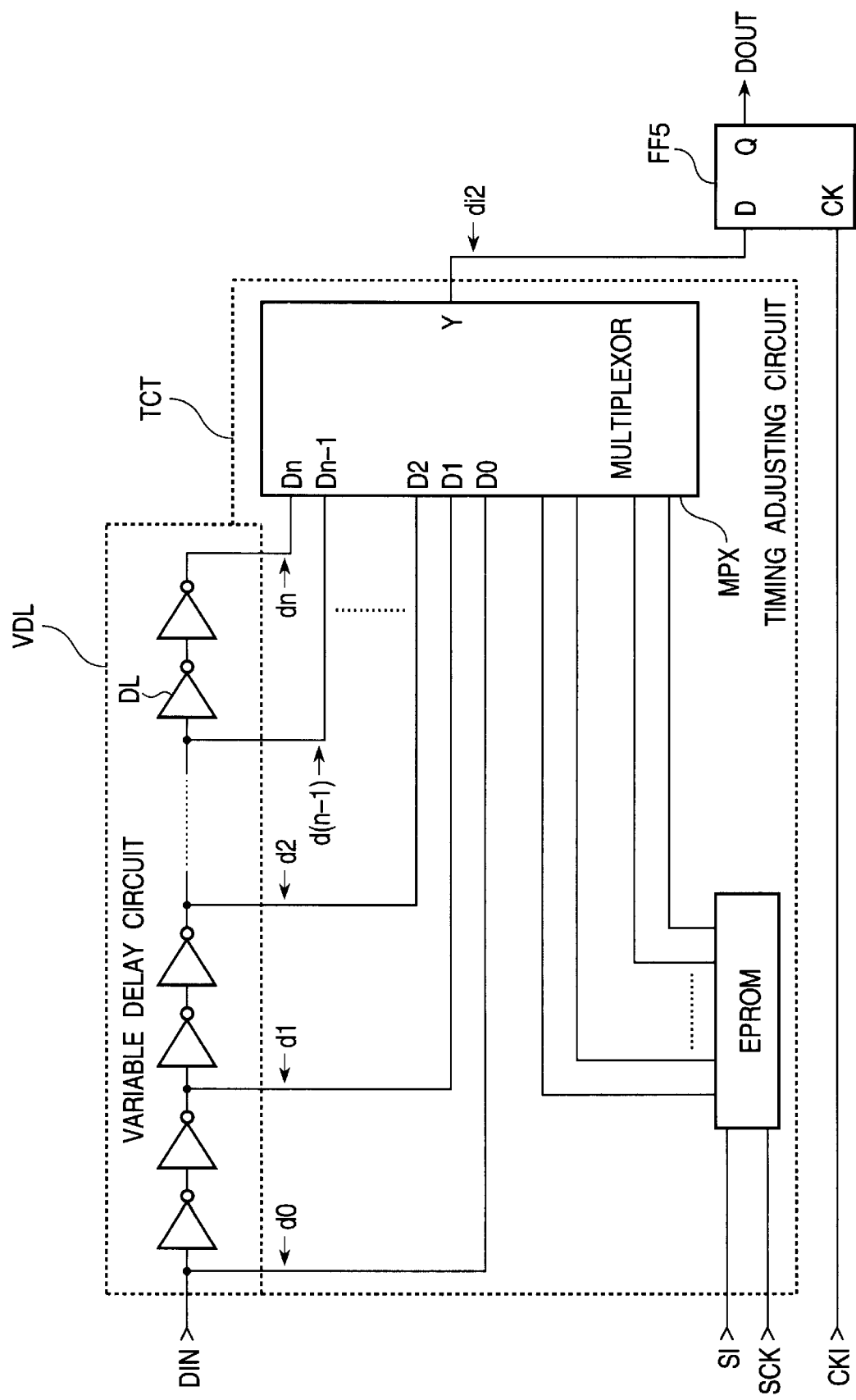
FIG. 20 is a logic circuit diagram of still another example of the prior art digital frequency multiplying circuit.

Referring to FIG. 16C showing the truth table of the selector, when the SEL input is "0", the signal on the S terminal is selected. In this case, the S terminal of the selectors is fixed to "1", the selector SL21 outputs "1" at its output Y. Since the SEL input of the selectors SL22 and SL23 is "1", the selectors SL22 and SL23 select the signal on their D terminal, namely, "1" selected by the preceding selector.

Namely, the output "1" of the selector SL21 is outputted through the large delay "dx2" as the delayed output signal "do2", and further, the large delays "dx3" and "dx4" as the delayed output signal "do3" and "do4", respectively. Thus, the input terminal of the large delays "dx2", "dx3" and "dx4" are fixed to "1" by the fixed signal of "1", and therefore, becomes independent of the change of the input signal "ci". Therefore, the operating current does not flow, with the result that the current consumption can be reduced.

When the input signal "ci" changes to "0" and it is maintained that only the selection control signal "dsa1" is "1" and the other selection control signal "dsa2" and "dsa3" are "0", the delayed output signal "do1" of the first stage large delay "dx1" is brought to "1". Since only the selection control signal "dsa1 " is "1", the output of EXR1 becomes "0", so that the SEL input of the selector SL21 is set to "0". Since the SEL input is "0", the signal on the S terminal is selected. Also in this case, the selector SL21 outputs "1" at its output Y. Since the SEL input of the selectors SL22 and SL23 is "1", the selectors SL22 and SL23 select the signal on their D terminal, namely, "1" selected by the preceding selector, similarly to the previous situation. Because of this fixed signal of "1", the input terminal of the large delays "dx2", 37 dx3" and "dx4" are fixed to "1" by the fixed signal of "1", and therefore, becomes independent of the change of the input signal "ci". Therefore, the operating current does not flow, with the result that the current consumption can be reduced.

When the input signal "ci" changes to "1" again and only the selection control signal "dsa2" is "1" and the other selection control signal "dsa1" and "dsa3" are "0", the delayed output signal "do1" of the first stage large delay "dx1" is brought to "0". Since only the selection control signal "dsa2" is "1", the output of EXR2 becomes "0", so that the SEL input of the selector SL22 is set to "0". Since the SEL input of the selector SL22 is "0", the signal on the S terminal of the selector SL22 is selected. Also in this case, since the fixed signal of "1" is outputted, the input terminal of the large delay "dx3" is fixed to "1". Since the selector SL23 also selects this fixed signal of "1", the input terminal of the large delay "dx4" is also fixed to "1".

On the other hand, since the SEL input of the selector SL21 is "1", the selector SL21 selects the signal on the D terminal, namely, the output "do1" of the large delay "dx1", to output "do1" to the next stage large delay "dx2". Therefore, the delayed output signal "do2" is outputted from the large delay "dx2". Namely, the input signal "ci" is delayed by the large delays "dx1" and "dx2", but the succeeding large delays "dx3" and "dx4" do not operate, so that the current consumption can be reduced.

As seen from the above, when the input of the large delays "dx1", "dx2", "dx3" and "dx4" are fixed by the fixed signal of "1", these delays become independent of the change of the input signal "ci", and therefore, the operating current does not flow.

Similarly, the delay amount is selected in response to the activation of the only selected one of the selection control signals "dsa1" to "dsan", and on the other hand, the input of the non-selected large delays is fixed to "1", so that a wasteful current does not flow, and therefore, the current consumption can be reduced.

Here, it would be apparent to persons skilled in the art that, the second embodiment can be applied to not only the digital frequency-doubling circuit but also to a digital frequency-multiplying circuit for generating a frequency which is three times, four times or "n" time the frequency of the input signal, similarly to the first embodiment.

The second embodiment has been described as having the output stopper. However, it would also be apparent that, if it is not intended to reduce the current consumption, even if the output stoppers are omitted, the second embodiment can operate as the digital frequency-doubling circuit.

As mentioned above, the digital frequency-multiplying circuit in accordance with the present invention comprises a plurality of cascaded delays for sequentially delaying the phase of the input signal to be frequency-multiplied, little by little, and a logic circuit for performing a logical processing between the input signal and the delayed signal(s) outputted from the cascaded delays, so as to generate a desired frequency-multiplied signal, and is characterized in that the digital frequency-multiplying circuit also includes a plurality of cascaded first delay circuits, each including a plurality of cascaded delays, a delay amount discriminating means receiving a first delayed output signal outputted from a final stage of the cascaded first delay circuits for discriminating at a transition timing of the input signal, whether the obtained frequency-multiplied signal advances or delays in comparison of an optimum duty ratio, and a delay amount control means responding to the result of the discrimination of the delay amount discriminating means for generating a delay control signal optimizing the delay amount of the cascaded first delay circuits, With this arrangement, a first advantage is that the duty ratio of the obtained frequency-multiplied signal does not varies. The reason for this is as follows: The number of the cascaded delays effectively used for generating the delayed signal which is logically processed with the input signal for generating the frequency-multiplied signal, can be changed in a feedback control, to maintain the actual duty ratio of the obtained frequency-multiplied signal at an optimum value.

A second advantage is that, even after adjustment, the digital frequency-multiplying circuit can be compensate for variation of the power supply voltage, because the current delay amount can be adjusted in real time in the feedback control, by adjusting an internally provided delay amount adjusting means such as the shift register or the up-down counter.

A third advantage is that it is no longer necessary to initialize the delay value and to externally supply an input signal to a multiplexor for setting the delay amount, also because the current delay amount can be adjusted in real time in the feedback control, by adjusting an internally provided delay amount adjusting means such as the shift register or the up-down counter.

A fourth advantage is that the current consumption can be reduced, because, of the cascaded delays for generating the desired delayed signal, the non-used delays are stopped to operate, and the wasteful current is not consumed for the non-used delays.

The invention has thus been shown and described with reference to the specific embodiments. However, it should be noted that the present invention is in no way limited to the details of the illustrated structures but changes and modifications may be made within the scope of, the, appended claims.

What is claimed is:

1. A digital frequency-multiplying circuit comprising:

a plurality of cascaded first delay circuits;

each of said first delay circuits including a plurality of cascaded delays, a first delay circuit of the cascaded first delay circuits receiving an input signal to be frequency-doubled, a logic circuit receiving said input signal and a delayed output signal outputted from at least the first delay circuit of said cascaded first delay circuits, for generating a frequency-multiplied signal;

a delay amount discriminating means receiving a first delayed output signal outputted from a final first delay circuit of said cascaded first delay circuits and another delayed output signal from said first delay circuit of said cascaded first delay circuits for discriminating at a transition timing of said input signal, whether said frequency-multiplied signal advance or delays in obtaining optimum duty ratio; and a delay amount control means responding to the result of the discrimination of said delay amount discriminating means for generating a delay control signal optimizing a delay amount of said cascaded first delay circuits.

2. A digital frequency-multiplying circuit comprising:

a plurality of cascaded first delay circuits;

each of said first delay circuits including a plurality of cascaded delays, a first delay circuit of the cascaded first delay circuits receiving an input signal to be frequency-doubled, a logic circuit receiving said input signal and a delayed output signal outputted from at least the first delay circuit of said cascaded first delay circuits, for generating a freguency-multiplied signal;

a delay amount discriminating means receiving a first delayed output signal outputted from a final first delay circuit of said cascaded first delay circuits for discriminating at a transition timing of said input signal, whether said freguency-multiplied signal advance or delays in obtaining optimum duty ratio; and a delay amount control means responding to the result of the discrimination of said delay amount discriminating means for generating a delay control signal optimizing a delay amount of said cascaded first delay circuits, wherein said delay amount discriminating means includes a second delay circuit having a delay time equal to that of a first delay of said plurality of cascaded delays included in said first delay circuit of said cascaded first delay circuits, said second delay circuit receiving said first delayed output signal to output a second delayed output signal, a delay amount comparing means receiving said first delayed output signal and said second delayed output signal for carrying out comparison at said transition timing of said input signal, said delay amount comparing means generating a delay amount increasing signal when a delay amount of said cascaded first delay circuits is small, a delay amount fixing signal when said delay amount of said cascaded first delay circuits is optimum and a delay amount decreasing signal when said delay amount of said cascaded first delay circuits is large, said delay amount increasing signal, said delay amount fixing signal and said delay amount decreasing signal being supplied to said delay amount control means.

3. A digital frequency-multiplying circuit claimed in claim 2 wherein, for each one period of said input signal, at a falling of said input signal, said delay amount comparing means detects in which of four periods said first delayed output signal and said second delayed output signal are, said four periods includes a first period in which both said first delayed output signal and said second delayed output signal are at a logical level, 0 a second period in which said first delayed output signal and said second delayed output signal are at a logical level 1 and at the logical level 0, respectively, a third period in which both said first delayed output signal and said second delayed output signal are at the logical level 1, and a fourth period in which said first delayed output signal and said second delayed output signal are at the logical level 0 and at the logical level 1, respectively, and wherein when said first and said delayed output signals are in said first period, said delay amount comparing means activates only said delay amount decreasing signal, when said first and said delayed output signals are in said second period, said delay amount comparing means activates only said delay amount fixing signal, and when said first and said delayed output signals are in said third period or in said fourth period, said delay amount comparing means activates only said delay amount increasing signal.

4. A digital frequency-multiplying circuit claimed in claim 2 wherein each of said cascaded first delay circuits includes said plurality of cascaded delays, and a multiplexor receiving an output of each of said plurality of cascaded delays, for outputting a selected one, and said first delayed output signal is outputted from said final delay circuit of said cascaded first delay circuits to said delay amount comparing means and said second delay circuit, and wherein said delay amount control means includes a delay amount selection means receiving said delay amount increasing signal, said delay amount fixing signal, said delay amount decreasing signal and said input signal, for generating a plurality of selection control signals supplied to said multiplexor of each of said cascaded first delay circuits so as to cause said multiplexor to select one from respective outputs of said plurality of cascaded delays.

5. A digital frequency-multiplying circuit claimed in claim 4 wherein said cascaded first delay circuits includes N cascaded first delay circuits, where N is positive integer larger than 1, whereby an N-time frequency-multiplied signal is generated.

6. A digital frequency-multiplying circuit claimed in claim 5 wherein all said "N" cascaded first delay circuits have the same delay amount.

7. A digital frequency-multiplying circuit claimed in claim 4 wherein said delay amount selection means includes a shift register configured to shift 1 in a leftward direction when the delay amount is to be decreased, so as to alternatively and sequentially bring said plurality of selection control signals supplied to said multiplexor, to 1 in a direction from a large delay amount to a small delay amount, said shift register operating to shift 1 in a rightward direction when the delay amount is to be increased, so as to alternatively and sequentially bring said plurality of selection control signals supplied to said multiplexor, to 1 in a direction from a small delay amount to a large delay amount.

8. A digital frequency-multiplying circuit claimed in claim 4 wherein each of said cascaded first delay circuits includes a fixed delay group composed of a plurality of cascaded delays and a variable delay group composed of a plurality of cascaded delays, respective outputs of said plurality of cascaded delays of said variable delay group being supplied to said multiplexor.

9. A digital frequency-multiplying circuit claimed in claim 4 wherein each of said cascaded first delay circuits includes a large delay group composed of a plurality of cascaded large delays having a large delay amount, a large delay multiplexor receiving respective outputs of said plurality of cascaded large delays, for outputting a selected one of received delayed signals, a small delay group composed of a plurality of cascaded small delays having a small delay amount, a first one of said cascaded small delays receiving an output of said large delay multiplexor, a small delay multiplexor receiving respective outputs of said plurality of cascaded small delays, for outputting a selected one of received delayed signals, and wherein said delay amount selection means includes a small delay amount selection means receiving said delay amount increasing signal, said delay amount fixing signal and said delay amount decreasing signal for sequentially activating said selection control signals supplied to said small delay multiplexor, said small delay amount selection means generating a small delay amount selection carry signal if the delay amount is to be increased after the largest delay selection control signal of said selection control signals is activated, and said small delay amount selection means also generating a small delay amount selection borrow signal if the delay amount is to be decreased after the smallest delay selection control signal of said selection control signals is activated, and said delay amount selection means includes a large delay amount selection means receiving said small delay amount selection carry signal and said small delay amount selection borrow signal, for sequentially activating said selection control signals supplied to said large delay multiplexor.

10. A digital frequency-multiplying circuit claimed in claim 9 wherein each of said large delay group and said small delay group includes a selecting means for selectively supplying said input signal to an input of each delay or fixing said input of each delay to 1, wherein said large delay group includes an output stop means responding to said selection control signal supplied to said large delay multiplexor, for supplying said selecting means of the delays non-selected by said selection control signal, with a selective stop signal for stopping operation of the large delay, and wherein said small delay group includes an output stop means responding to said selection control signal supplied to said small delay multiplexor, for supplying said selecting means of the delays non-selected by said selection control signal, with a selective stop signal for stopping operation of the small delay.

11. A digital frequency-multiplying circuit claimed in claim 9 wherein aid large delay amount selection means includes an up-down counter, and wherein said small delay amount selection means includes an up-down counter, which is configured to carry out an up-count operation when the delay amount is to be increased, so as to alternatively and sequentially bring said plurality of selection control signals supplied to said small delay multiplexor, to 1 in a direction in a direction from a small delay amount to a large delay amount, and when the delay amount is still small, said up-down counter of said small delay amount selection means generates said small delay amount selection carry signal, and said up-down counter of said small delay amount selection means carrying out a down-count operation when the delay amount is to be decreased, so as to alternatively and sequentially bring said plurality of selection control signals supplied to said small delay multiplexor, to 1 in a direction from a large delay amount to a small delay amount, and when the delay amount is still large, said up-down counter of said small delay amount selection means generates said small delay amount selection borrow signal.

* * * * *